United States Patent
Yokoyama et al.

(10) Patent No.: US 6,607,277 B2
(45) Date of Patent: *Aug. 19, 2003

(54) PROJECTOR DISPLAY COMPRISING LIGHT SOURCE UNITS

(75) Inventors: Osamu Yokoyama, Suwa (JP); Satoru Miyashita, Suwa (JP); Hiroshi Kamakura, Suwa (JP); Tatsuya Shimoda, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,958

(22) PCT Filed: Sep. 24, 1997

(86) PCT No.: PCT/JP97/03387

§ 371 (c)(1),
(2), (4) Date: Jul. 20, 1998

(87) PCT Pub. No.: WO98/13725

PCT Pub. Date: Apr. 2, 1998

(65) Prior Publication Data

US 2001/0013924 A1 Aug. 16, 2001

(30) Foreign Application Priority Data

Sep. 24, 1996 (JP) ............................... 8-252084
Dec. 27, 1996 (JP) ............................... 8-350197

(51) Int. Cl.$^7$ ................................................ G03B 21/16
(52) U.S. Cl. ........................................... 353/52; 353/85
(58) Field of Search ................................ 349/5, 69, 71, 349/72; 353/52, 85; 348/739, 751, 800; 313/503, 504, 505, 506

(56) References Cited

U.S. PATENT DOCUMENTS 4,547,702 A * 10/1985 Schrank ....................... 313/509
4,904,901 A * 2/1990 Simonopoulos et al. ..... 313/509

(List continued on next page.)

FOREIGN PATENT DOCUMENTS

DE 4102954 A 8/1991
EP 0 367 332 A 5/1990

(List continued on next page.)

OTHER PUBLICATIONS

Takahiro Nakayama et al., "Organic Luminescent Devices with Optical Microcavity Structure", Technical Report of IEICE OME94–79 (Mar.–1995).

(List continued on next page.)

*Primary Examiner*—Safet Metjahic
*Assistant Examiner*—E P LeRoux
(74) *Attorney, Agent, or Firm*—Oliff & Berridge, PLC

(57) ABSTRACT

A projection display apparatus employing organic EL elements is presented that is light in weight, is small in size, and can be practically implemented. In particular, the apparatus suppresses light-emission performance degradation caused by generated heat, thereby extending useful life, stabilizing brightness, and securing continual maximum brightness. The apparatus comprises; liquid crystal panels 12R, 12G, and 12B; light emitting units 13R, 13G, and 13B, positioned at the back of the liquid crystal panels and provided with organic EL elements as light emitting layers; and cooling bodies 14R, 14G, and 14B, positioned at the back of the light emitting units, for dispersing the heat generated by the light emitting layers. The cooling bodies 14R, 14G, and 14B may, for example, be electronic cooling elements that employ the Peltier effect to absorb and radiate the generated heat. Alternatively, the cooling bodies may be configured as heat-dispersing fins that guide and disperse generated heat.

37 Claims, 28 Drawing Sheets

U.S. PATENT DOCUMENTS

| | | | | |
|---|---|---|---|---|
| 4,975,692 A | * | 12/1990 | Tateyama | 340/781 |
| 5,013,967 A | * | 5/1991 | Hirotaka et al. | 313/512 |
| 5,073,446 A | * | 12/1991 | Scozzafava et al. | 428/323 |
| 5,151,629 A | * | 9/1992 | Vanslyke | 313/504 |
| 5,170,194 A | * | 12/1992 | Kuretmatsu et al. | 353/52 |
| 5,229,883 A | * | 7/1993 | Jackson et al. | 359/569 |
| 5,276,380 A | * | 1/1994 | Tang | 313/504 |
| 5,294,870 A | * | 3/1994 | Tang et al. | 313/504 |
| 5,406,172 A | | 4/1995 | Bennett | |
| 5,457,359 A | * | 10/1995 | Meyer | 315/194 |
| 5,504,599 A | * | 4/1996 | Okibayashi et al. | 359/50 |
| 5,528,339 A | * | 6/1996 | Buhr et al. | 355/32 |
| 5,568,417 A | * | 10/1996 | Furuki et al. | 365/106 |
| 5,594,463 A | * | 1/1997 | Sakamoto | 345/76 |
| 5,598,067 A | * | 1/1997 | Vincent et al. | 315/169.3 |
| 5,634,835 A | * | 6/1997 | Wu et al. | 445/24 |
| 5,637,359 A | * | 6/1997 | Fukuchi et al. | 428/1 |
| 5,643,642 A | * | 7/1997 | Oishi et al. | 428/1 |
| 5,841,494 A | * | 11/1998 | Hall | 349/98 |
| 5,847,506 A | * | 12/1998 | Nakayama et al. | 313/504 |
| RE36,060 E | * | 1/1999 | Miyashita | 348/748 |
| 5,865,521 A | * | 2/1999 | Hashizume et al. | 353/38 |
| 5,958,609 A | * | 9/1999 | Ueda et al. | 428/690 |
| 6,140,571 A | * | 10/2000 | Kitahara et al. | 174/16.3 |
| 6,369,785 B1 | * | 4/2002 | Imai | 345/76 |

FOREIGN PATENT DOCUMENTS

| | | |
|---|---|---|
| EP | 0 838 715 A | 4/1998 |
| GB | 2191 057 A | 12/1987 |
| JP | 51-119243 | 10/1976 |
| JP | A-63-314795 | 12/1988 |
| JP | A-4-192290 | 7/1992 |
| JP | A-5-114480 | 5/1993 |
| JP | A-6-130424 | 5/1994 |
| JP | 07-154725 | 6/1995 |
| JP | 7-263142 | 10/1995 |
| JP | A-7-263142 | 10/1995 |
| JP | 8-083688 | 3/1996 |
| JP | 08211832 A | 8/1996 |
| JP | A-9-15596 | 1/1997 |
| JP | 9-015596 | 1/1997 |
| JP | 9-073983 | 3/1997 |
| JP | A-9-258160 | 10/1997 |

OTHER PUBLICATIONS

Shizuo Tokito et al., et al. "Strongly Directed Single Mode Emission From Organic Electroluminescent Diode with a Microcavity", Appl. Phys. Lett. 68 (19), May 6, 1996.

* cited by examiner

PROJECTOR DISPLAY COMPRISING LIGHT SOURCE UNITS

BACKGROUND OF THE INVENTION

1. Field of the Invention

The present invention concerns a projection type display apparatus that comprises light source units comprising cooling means and light emitting units that include light emitting layers comprising organic EL (electroluminescence) elements, wherein the light emitted from the light emitting units is guided to liquid crystal panels, and the images displayed on the liquid crystal panels are enlarged and projected by a lens or lenses.

The present invention also concerns cooling control technology for cooling the light emitting units that employ light emitting layers made up of organic EL (electroluminescence) elements and that are used in various fields. More particularly, the present invention pertains to a light source apparatus formed by adding temperature detection means or elapsed time measuring means to light source units comprising light emitting units and cooling means, and to a method and apparatus for controlling a light source apparatus that controls the cooling means by the temperature detection means or elapsed time measuring means in the light source apparatus.

2. Description of the Related Art

In recent years, with the amazing advances being made in semiconductor technology, various electronic display devices other than CRT displays are being developed and turned into marketable products. One of these which is drawing much attention is the projection display apparatus, a technology that is advantageous in terms of lower power consumption and lighter weight.

One type of such a projection display apparatus that is known is the liquid crystal projector wherewith images on a liquid crystal panel are enlarged and projected by a projection lens onto a reflective or transmissive screen and thus displayed. One example of such a liquid crystal projector is diagramed in FIG. 31.

The liquid crystal projector diagrammed in FIG. 31 comprises a light source lamp unit 202 inside a cabinet. Electrical discharge lamps such as metal halide lamps, or halogen lamps, are used in the light source lamp unit 202. The light emitted from this light source lamp unit 202 is guided via a mirror 203 to dichroic mirrors 204 and 205, whereby it is separated into red light green light, and blue light. Of the three color components into which the light is separated, the red light passes by way of a mirror 206 to a red displaying liquid crystal panel 209, the green light is led directly to a green displaying liquid crystal panel 210, and the blue light is led by way of mirrors 207 and 208 to a blue displaying liquid crystal panel 211.

The images displayed on the three liquid crystal panels 209 through 211, respectively, are illuminated by their respective colors, and this light is combined by a dichroic prism 212. The combined light is enlarged by a projection lens 213 and projected, in enlarged form, on a reflecting screen (not shown), for example.

With a liquid crystal projector in which a light source lamp unit 202 such as this is used, however, the light emitted from the metal halide lamp or halogen lamp must be radiated with good parallelism onto the liquid crystal panel. For this purpose, as diagrammed in FIG. 31, it is necessary to provide the light source lamp unit 202 with a reflector 202A having a rather large aperture. This constitutes a serious problem in that it makes it difficult to meet the demand for lighter weights and smaller sizes in the overall projector. As is depicted in FIG. 31, moreover, it is preferable that the lamp in the light source be cooled. The larger the capacity of the lamp, in fact, the higher must the cooling capability of the cooling fan be.

In the case of a so-called triple liquid crystal projector, moreover, in which three separate liquid crystal panels are provided for the red, green, and blue colors, as described in the foregoing, a light dividing optical system is necessary to take the light emitted from the single-lamp light source and divide it into the colors on the three liquid crystal panels. This makes it even more difficult to achieve the desired reduction in weight and size.

A first example of the related art is now discussed.

In recent years, in an effort to break out of this dilemma, the use of organic EL elements as the light emitting unit has been proposed. This reflects the fact that many reports have been made of light of high brightness being emitted by EL elements using an organic thin film for the light emitting layer. These light emitting units are thin planar light sources in which are formed an electric-field light-emission (electroluminescence=EL) layer consisting of an organic thin film. Compared to inorganic EL elements, organic EL elements can operate at low voltage and provide high brightness. Thus they are believed to be well suited for use in enlarging-projection type projection display apparatuses, and much research is being focused on the practical implementation of such devices.

An example of a triple liquid crystal projector in which such organic EL elements are used as the light source unit is diagrammed in FIGS. 32 and 33. In the liquid crystal projector depicted in these drawings, light source units 224, 225, and 226, in which are used organic EL elements that emit red, green, and blue light, respectively, are positioned, respectively, behind and in close proximity to three liquid crystal panels 221, 222, and 223, which display red, green, and blue colors. Item 227 is a dichroic prism, and 228 is a projection lens. An example of this type of projection display apparatus is disclosed in laid-open patent application (Tokkai) S51-119243 [1976] (gazette).

Even with such a triple liquid crystal projector such as this, however, in which organic EL elements are used as the light source unit, the organic EL elements produce heat when they are driven, and thus require cooling.

A second example of the related art is now discussed.

One possible means of forcibly cooling such organic EL elements as these is to employ electrical cooling elements that utilize the Peltier effect.

Nevertheless, in the liquid crystal projector of the first example of the related art depicted in FIGS. 32 and 33 and described above, a planar light emitting unit in which organic EL elements are used is employed, thus making it possible to achieve smaller sizes and lighter weights, but some unresolved problems remain, as noted below. These problems present obstacles which prevent this technology from being practically implemented.

In the first place, even though these are called organic EL elements, they produce heat when they are driven, and this emission of heat causes the light emitting performance to gradually deteriorate, shortening the useful life of the elements.

Furthermore, if the light emission performance of a light source unit in which organic EL elements are used has fallen below allowable limits, then one would like to be able to replace only the light source unit. In a color-displaying triple liquid crystal projector, in particular, light source units are provided for each of the three liquid crystal panels, so the number thereof is high. A deterioration in the performance of one or two of the light source units destroys the color balance of the displays on the screen, so the effects thereof are great. In such cases, it would be economical to be able to simply replace only those light source units which have reached the limit of their useful life. Previously, however, no structure has been proposed for such light source units which would make them independent and easily replaceable. This has obliged repair personnel to go to the great trouble of changing out light source units on boards on which they are mounted.

When making such replacements, it is very important not only to insure the electrical connection with the light source unit after replacement, but also to insure that it has been restored to the prescribed optical position. If the orientation or position of the replaced light source unit is off, the way in which light strikes the liquid crystal panels will be altered, the picture on the screen may be partially darkened, and the display performance may be degraded.

Another important aspect to consider when making replacements is rightly judging when exactly to make the replacement. If such replacement is made late, brightness may be reduced, and viewers may have to put up with pictures that exhibit distorted color balance. Conversely, if the replacement is made too early, that will adversely affect economy. In other words, it is important to judge when the right time to make the replacement is. Previously, however, no effective way to remedy this had been proposed.

Furthermore, the light emitted from planar light source units in which organic EL elements are used is not necessarily parallel, and when it strikes a liquid crystal panel it exhibits the property of widely spreading out. For this reason, the light emitted from the light source units contains much wasted light that does not contribute to the display of the image on the liquid crystal panels, by which measure the brightness of the displayed picture deteriorates. Moreover, efforts to raise the display brightness to compensate for this wasted light result in recklessly raising the light emission output of the organic EL elements, which leads to a vicious cycle in which the heat generated degrades the light emission performance and leads to even more severe shortening of useful life.

In terms of enhancing the efficiency with which light is emitted from this light source unit, transparent glass plates placed on the emission side of the organic thin films making up the organic EL elements play an important role.

Conventionally, however, these plates have been of a simple form in which both front and back surfaces are parallel.

With the first example of the related art discussed above, it has been very difficult to achieve a practical projection display apparatus due to the many problems cited.

With the second example of the related art, moreover, when light emitting units comprising organic EL elements, and cooling means, are employed, and electronic cooling elements are used to cool the organic EL elements, if one begins driving the cooling elements simultaneously with lighting the organic EL elements, the temperature of the organic EL elements will rise before they are cooled, whereupon the organic EL elements will be thermally degraded, which constitutes a problem.

When the cooling elements are activated first, and the organic EL elements are lighted subsequently, the organic EL elements are cooled before they emit light, causing dew to form. This also constitutes a problem.

Furthermore, when the use of the light source apparatus is discontinued, if the timing between extinguishing the organic EL elements and stopping the cooling elements is improper, either the organic EL elements will suffer thermal degradation or dew will be formed. This constitutes yet another problem.

A first major object of the present invention is to provide a projection display apparatus in which are employed light source units comprising cooling means and a light emitting unit comprising organic EL elements, which is light in weight, is small in size, and can be practically implemented.

One specific object of the present invention is to make it possible to prevent degradation in light emission performance caused by heat generation in the organic EL elements, thereby making it possible to increase useful life, stabilize brightness, and secure maximum brightness continually.

Another specific object of the present invention is to establish independent light emitting units comprising organic EL elements, such that they can easily be replaced so that their electrical connection and optical positioning are secured, and so that the replacement operation is rendered more efficient and maintenance and inspection are made easier.

Another specific object of the present invention is to make it possible to easily judge when replacements should be made, thus making it possible to insure high picture display quality, and rendering maintenance and inspection easier.

Another specific object of the present invention is to enhance the efficiency with which light strikes the liquid crystal panels.

Another specific object of the present invention is to enhance the efficiency with which light is emitted from the light source unit by the organic EL elements, by improving the transparent substrates on which the light source units are mounted.

A second major object of the present invention is to provide a light source apparatus wherewith it is possible to prevent both thermal degradation in the organic EL elements and the formation of dew, together with a method and an apparatus for controlling the light source apparatus.

SUMMARY OF THE INVENTION

In order to achieve the first object cited above, the projection display apparatus according to the present invention comprises: transmissive liquid crystal panels that display images; light source units that are positioned on the back side of the liquid crystal panels and that comprise light emitting units provided with organic EL elements as light emitting layers and cooling means provided in the light emitting units for radiating heat generated by the light emitting units; and a projection lens positioned in front of the liquid crystal panels for enlarging images displayed on the liquid crystal panels and projecting them onto a screen.

For example, the cooling means exhibit a structure wherein there are electronic cooling means utilizing the Peltier effect positioned at the back of reflecting electrode layers positioned at the back of the light emitting units, and thermal conductors that conduct generated heat are interposed between the light emitting units and the electronic cooling means.

For example, moreover, the cooling means comprise cooling bodies provided with heat-radiating fins that conduct and radiate the generated heat, provided at the back of reflective electrode layers positioned at the back of the light emitting layers, and sealing substrates that seal off the portions of light emitting film structures that include the reflecting electrode layers, and that integrate the sealing substrates and the cooling bodies.

Also, the surface areas of the heat-radiating fins of the cooling bodies are formed so that the center portions of the light emitting units are larger than the end portions.

For example, moreover, the organic EL elements are elements that generate white light.

For example, moreover, the liquid crystal panels comprise three liquid crystal panels that separately display images in red components, green components, and blue components, the organic EL elements comprising three organic EL elements that separately generate red, green, and blue light, exhibiting a structure wherein a dichroic prism is interposed in the optical path between the three liquid crystal panels and the projection lens.

In order to achieve the first object and the specific objects noted above, the projection display apparatus to which the present invention pertains comprises transmissive liquid crystal panels that display images; light emitting units positioned in back of the liquid crystal panels and provided with light emitting layers comprising organic EL elements; and attachment means for attaching the light emitting units, such that they can be freely attached and detached, to at least the portion of a base on which is mounted the liquid crystal panels and the light emitting units.

For example, moreover, the light emitting units comprise bases that mount both electrode layers that sandwich the light emitting layers and terminals that are electrically connected to the electrode layers, while the attachment means are equipped both with connectors that plug terminal units into the base portions, such that they can be freely plugged and unplugged, the terminal units having mounted in them the terminals of the boards, and with guides that guide the boards in the direction of connector plug-in, when the terminal units of the boards are inserted into the connectors.

For example, moreover, light source units are provided which comprise cooling means for radiating heat generated by the light emitting layers, and light emitting units containing the light emitting layers.

For example, moreover, the cooling means comprise heat-radiating fins that are provided on the back side of the reflective electrode layers positioned at the back of the light emitting layers, which conduct and radiate the generated heat.

Furthermore, in order to achieve the first object noted above, the projection display apparatus to which the present invention pertains comprises transmissive liquid crystal panels that display images, and light emitting units, positioned at the back of the liquid crystal panels, in which light emitting layer structures having light emitting layers made up of organic EL elements are provided on transparent substrates, wherein means for raising the light-emission efficiency are formed integrally on the light emitting surfaces of the transparent substrates of the light emitting units.

For example, moreover, the means for raising the light-emission efficiency are microlens arrays formed two-dimensionally an the light-emission surfaces.

For example, moreover, the means for raising the light-emission efficiency are microprism arrays formed two-dimensionally on the light-emission surfaces.

In order to achieve the first object and the specific objects noted earlier, the projection display apparatus to which the present invention pertains comprises light emitting units positioned at the back of liquid crystal panels and having light emitting film structures, the light emitting layers of which are organic EL elements, provided on transparent substrates; voltage measuring means for measuring voltages on terminals between the electrodes of the light emitting film structures; useful-life assessment means that assess the useful life remaining in the light emitting film structures; and announcement means that announce the useful life when the useful-life assessment means have assessed the useful life.

Here, for example, the useful-life assessment means are means that assess the useful life by converting the values of the voltages on the terminals to brightness values and comparing these against reference values.

For example, moreover, here are comprised color-balance assessment means for assessing the red, green, and blue color balance on the basis of the terminal voltage values measured by the voltage measuring means, and color-balance correction means that automatically correct the color balance on the basis of the results of the assessments of the color-balance assessment means.

For example, moreover, the light emitting layer structure for the light emitting units comprises a resonator structure that selectively resonates and emits light of a particular wavelength.

In order to achieve the two objects noted above, the light source apparatus to which the present invention pertains comprises light source units comprising light emitting units provided with organic EL elements as light emitting layers and cooling means provided in the light emitting units for radiating heat generated by the light emitting units; and temperature detection means for measuring the temperature of the cooling means.

In order to achieve the two objects noted above, the light source apparatus to which the present invention pertains comprises light source units comprising light emitting units provided with organic EL elements as light emitting layers and cooling means provided in the light emitting units for radiating heat generated by the light emitting units; and temperature detection means for measuring the temperature of the organic EL elements.

In order to achieve the two objects noted above, the light source apparatus to which the present invention pertains comprises light source units comprising light emitting units provided with organic EL elements as light emitting layers and cooling means provided in the light emitting units for radiating heat generated by the light emitting units; and at least one or otter of elapsed time measuring means for measuring the elapsed time after the start of the cooling means or elapsed time measuring means for measuring the elapsed time after the stopping of the cooling means.

In order to achieve the two objects noted above, the light source apparatus control method to which the present invention pertains is a light source apparatus control method for controlling cooling starts and the lighting of a light source comprising light source units comprising light emitting units provided with organic EL elements as light emitting layers and cooling means provided in the light emitting units for radiating heat generated by the light emitting units, and temperature detection means for measuring the temperature of the cooling means; wherein the organic EL elements are lighted at the point in time when the temperature detected by the temperature detection means reaches a set temperature, after the cooling means have been started.

In order to achieve the two objects noted above, the light source apparatus control method to which the present invention pertains is a light source apparatus control method for controlling cooling starts and the lighting of a light source comprising light source units comprising light emitting units provided with organic EL elements as light emitting layers and cooling means provided in the light emitting units for radiating heat generated by the light emitting units, and temperature detection means for measuring the temperature of the organic EL elements; wherein the organic EL elements are lighted at the point in time when the temperature detected by the temperature detection means reaches a set temperature, after the cooling means have been started.

In order to achieve the two objects noted above, the light source apparatus control method to which the present invention pertains is a light source apparatus control method for controlling cooling stoppages and the extinguishing of a light source comprising light source units comprising light emitting units provided with organic EL elements as light emitting layers and cooling means provided in the light emitting units for radiating heat generated by the light emitting units, and temperature detection means for measuring the temperature of the cooling means; wherein after reducing the drive current going to the organic EL elements, the cooling means are stopped, and the organic EL elements are extinguished at the point in time when the temperature detected by the temperature detection means reaches a set temperature.

In order to achieve the two objects noted above, the light source apparatus control method to which the present invention pertains is a light source apparatus control method for controlling cooling stoppages and the extinguishing of a light source comprising light source units comprising light emitting units provided with organic EL elements as light emitting layers and cooling means provided in the light emitting units for radiating heat generated by the light emitting units, and temperature detection means for measuring the temperature of the organic EL elements; wherein after reducing the drive current going to the organic EL elements, the cooling means are stopped, and the organic EL elements are extinguished at the point in time when the temperature detected by the temperature detection means reaches a set temperature.

In order to achieve the two objects noted above, the light source apparatus control method to which the present invention pertains is a light source apparatus control method for controlling cooling starts and the lighting of a light source comprising light source units comprising light emitting units provided with organic EL elements as light emitting layers and cooling means provided in the light emitting units for radiating heat generated by the light emitting units, and elapsed time measuring means for measuring the elapsed time from the start of the cooling means; wherein the organic EL elements are lighted after a certain time has elapsed since the cooling means were started.

In order to achieve the two objects noted above, the light source apparatus control method to which the present invention pertains is a light source apparatus control method for controlling cooling stoppages and the extinguishing of a light source comprising light source units comprising light emitting units provided with organic EL elements as light emitting layers and cooling means provided in the light emitting units for radiating heat generated by the light emitting units, and elapsed time measuring means for measuring the elapsed time from the stoppage of the cooling means; wherein after reducing the drive current going to the organic EL elements, the cooling means are stopped, and the organic EL elements are extinguished a certain time thereafter.

In order to achieve the two objects noted above, the light source apparatus control apparatus to which the present invention pertains is a control apparatus for a light source apparatus that comprises light source unite comprising light emitting units provided with organic EL elements as light emitting layers and cooling means provided in the light emitting units for radiating heat generated by the light emitting units, and temperature detection means for measuring the temperature of the cooling means, and that illuminates liquid crystal display elements with light radiated from the organic EL elements; wherein the light source apparatus is controlled so that, when lighting the organic EL elements, the organic EL elements are lighted at the point in time when, after the cooling means have been started, the temperature detected by the temperature detection means reaches a set value for lighting, and, when extinguishing the organic EL elements, the cooling means are stopped after reducing the drive current going to the organic EL elements, and the organic EL elements are extinguished at the point in time when the temperature detected by the temperature detection means reaches a set value for extinguishing.

In order to achieve the two objects noted above, the light source apparatus control apparatus to which the present invention pertains is a control apparatus for a light source apparatus that comprises light source units comprising light emitting units provided with organic EL elements as light emitting layers and cooling means provided in the light emitting units for radiating heat generated by the light emitting units, and temperature detection means for measuring the temperature of the organic EL elements, and that illuminates liquid crystal display elements with light radiated from the organic EL elements; wherein the light source apparatus is controlled so that, when lighting the organic EL elements, the organic EL elements are lighted at the point in time when, after the cooling means have been started, the temperature detected by the temperature detection means reaches a set value for lighting, and, when extinguishing the organic EL elements, the cooling means are stopped after reducing the drive current going to the organic EL elements, and the organic EL elements are extinguished at the point in time when the temperature detected by the temperature detection means reaches a set value for extinguishing.

In order to achieve the two objects noted above, the light source apparatus control apparatus to which the present invention pertains is a control apparatus for a light source apparatus that comprises light source units comprising light emitting units provided with organic EL elements as light emitting layers and cooling means provided in the light emitting units for radiating heat generated by the light emitting units, and both elapsed time measuring means for measuring the elapsed time from the start of the cooling means and elapsed time measuring means for measuring the elapsed time from the stoppage of the cooling means, and that illuminates liquid crystal display elements with light radiated from the organic EL elements; wherein the light source apparatus is controlled so that, when lighting the organic EL elements, the organic EL elements are lighted after a certain time has elapsed since the cooling means were started, and so that, when extinguishing the organic EL elements, the cooling means are stopped after reducing the drive current going to the organic EL elements, and the organic EL elements are extinguished a certain time thereafter.

For example, moreover, the control apparatus for the light source apparatus is applied to a projection type projection display apparatus which takes images displayed on the liquid crystal display elements and enlarges and projects them by a projection lens.

DESCRIPTION OF THE PREFERRED EMBODIMENTS

Projection display apparatuses concerning preferred embodiments of the present invention are described below, with reference to the attached drawings. In the embodiments described below, a liquid crystal projector is adopted as the liquid crystal display apparatus.

Figure 1:
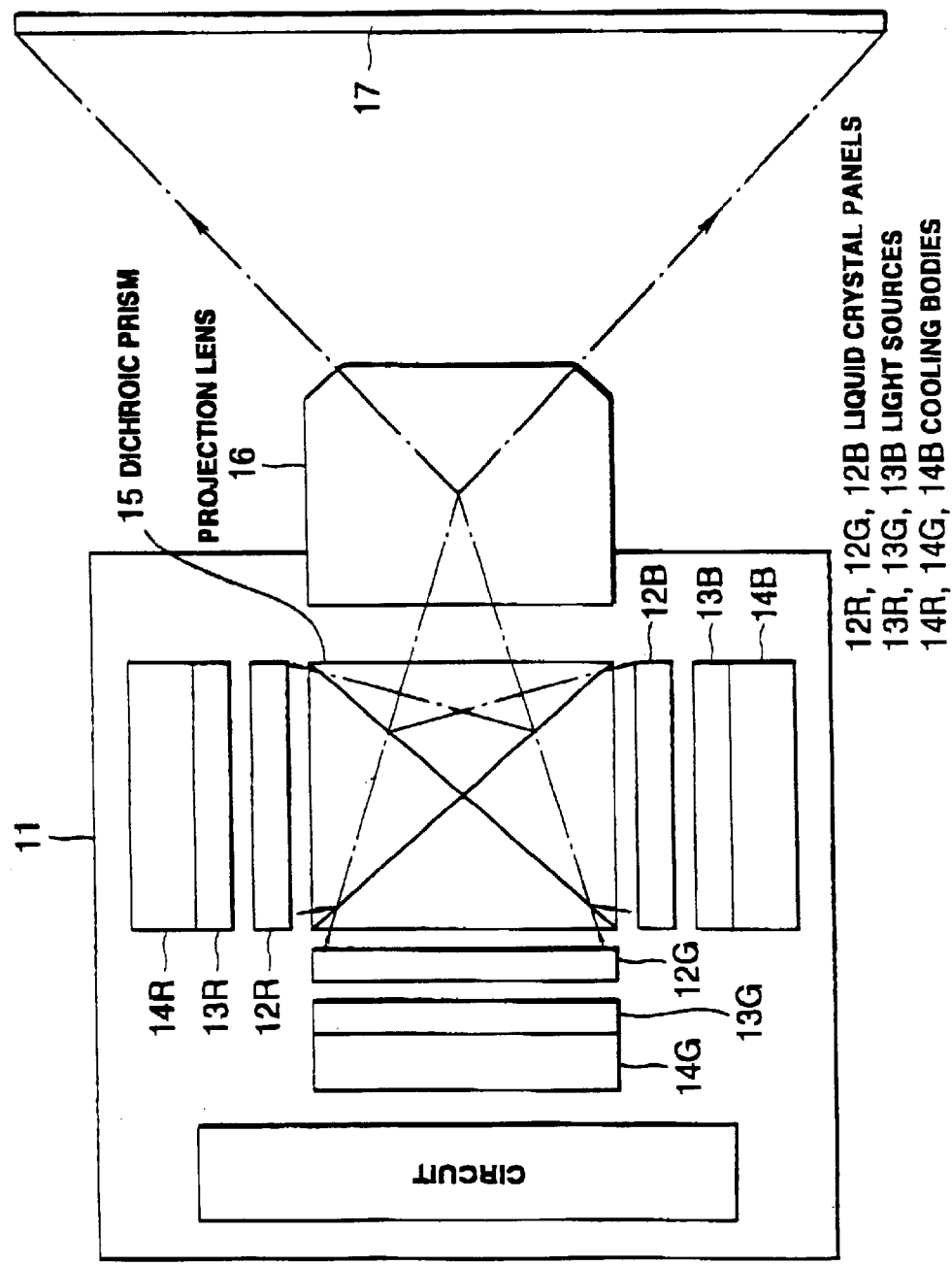
FIG. 1 is a simplified plan of a liquid crystal projector that concerns a first embodiment of the present invention.

A first embodiment is now described with reference to FIGS. 1 to 3. The liquid crystal projector diagrammed in FIG. 1 is configured as a rear-projecting type of triple liquid crystal projector.

This liquid crystal projector comprises a cabinet 11. Inside the cabinet 11 are provided three liquid crystal panels 12R, 12G, and 12B that perform image displays in red, green, and blue, respectively, panel-form light emitting units 13R, 13G, and 13B positioned in correspondence with the liquid crystal panels, respectively, panel-form cooling bodies 14R, 14G, and 14B positioned as cooling means for each of the light source units, a dichroic prism 15, and a projection lens 16. Light source units are configured by the light emitting units 13R, 13G, and 13B, and the cooling bodies 14R, 14G, and 14B. The liquid crystal panels 12R, 12G, and 12B and the light source units (i.e. the light emitting units 13R, 13G, and 13B, and the cooling bodies 14R, 14G, and 14B) are positioned on the light-incidence side of the side surfaces of the dichroic prism 15 for each display color combination.

The projection lens 16 is positioned on the light-emission side of the dichroic prism 15. A transmissive screen 17 is positioned on the light-emission side of the projection lens 16, at a prescribed distance therefrom. The projection lens 16 is represented as a single lens in the drawing, but ordinarily it will be made up of a plurality of lenses.

This liquid crystal projector is classified as a rear-projecting type. That is because it is a type wherein an enlarged image is projected from the back side (the side where the projector is) of the transmissive screen 17 which is of a size of about 20 inches. In a liquid crystal projection television, this screen is secured to the cabinet 11.

Here, the surface on the light-source side of each of the liquid crystal panels 12R, 12G, and 12B is called the back or back surface, and that direction is called the back side, while the light-emission sides of the liquid crystal panels 12R, 12G, and 12B, respectively, are called the front or front surface sides, as necessary. The liquid crystal panels 12R, 12G, and 12B are formed, respectively, by laminating a substrate, polarizing panel, and phase contrast panel, etc., to form elements in which a sandwiched-in liquid crystal layer is electrically driven, such that they display red, green, and blue images. The size of each of the liquid crystal panels, stated as a diagonal sizes may be 33 mm (1.3 inches), for example.

For the light emitting units 13R, 13G, and 13B, organic EL (electroluminescence) elements are used. These organic EL elements are formed in panels and have an electric-field light emitting layer structure comprising organic thin films that handle the emission of red, green, and blue light, respectively.

Figure 2:
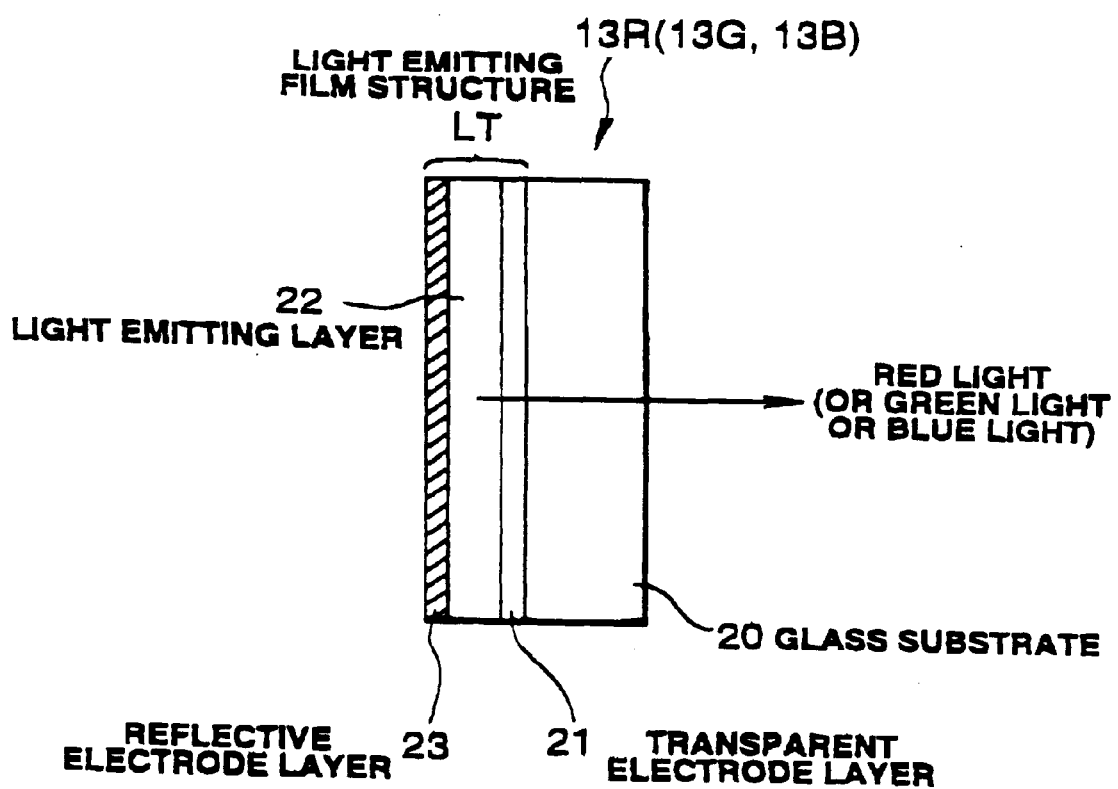
FIG. 2 is a diagram depicting the way layers are laminated in a light emitting unit having an organic EL element as the light emitting layer.

More specifically, each of the light emitting film portions of the light emitting units 13R, 13G, and 13B, respectively, as diagramed in FIG. 2, comprises a glass substrate that is a transparent substrate 20, a transparent electrode layer 21 consisting of a transparent electrically conducting thin film layer formed on the glass substrate, a light emitting layer 22 consisting of an organic thin film layer that emits red, green, or blue light, formed on the electrode layer, and a reflective electrode layer 23 consisting of a metallic film that doubles as a reflective mirror, laminated so as to sandwich in the light emitting layer. A light emitting film structure LT is formed by the transparent electrode layer 21, light emitting layer 22, and reflective electrode layer 23. The effective light emitting region of the light source unit is formed to have a diagonal size of 33 mm or greater, and is positioned in close proximity to the back surface of the liquid crystal panel.

The light emitting layer 22 emits red, green, or blue light when the electric field is applied between the transparent electrode layer 21 and the reflective electrode layer 23. For the organic materials used to form the organic thin films, a material in which a red fluorescent pigment is added to a quino-lithol-aluminum complex or the like is used for red (wavelength≡610 nm), a quinoline-aluminum, or more precisely, hydroxyquinoline-aluminum complex or the like like is used for green (wavelength≡540 nm), and a zinc oxazole complex or the like is used for blue (wavelength≡460 nm).

Figure 3:
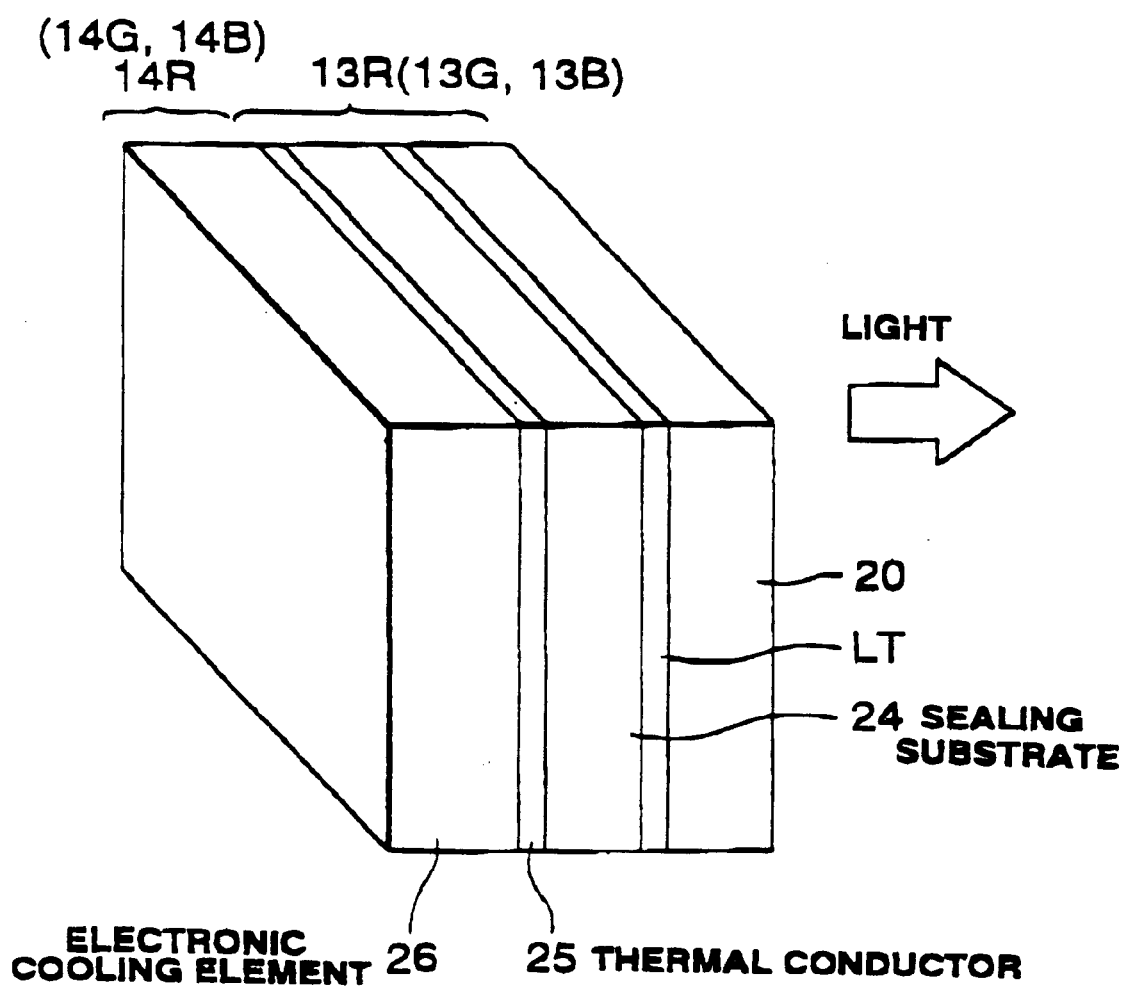
FIG. 3 is a diagram showing how a cooling body is attached as cooling means to a light emitting unit.

The light emitting units 13R, 13G, and 13B, respectively, as diagramed in FIG. 3, are provided with a sealing substrate 24 that is bonded to the back side of the light emitting film structure LT so as to seal it off. A metal such as aluminum or copper is suitable for the material of this sealing substrate 24.

Each of the cooling bodies 14R, 14G, and 14B, respectively, is provided with a thermal conductor 25 that conducts heat away from the sealing substrate 24, and with a panel-form electronic cooling element 26 that is bonded to the back side of the thermal conductor 25. A liquid or metal that in a good conductor of heat is used for the thermal conductor 25. Examples of such materials are silicon grease having outstanding thermal conductivity and adhesives having outstanding thermal conductivity. Alternatively this may even be solder. It is preferable that the thermal conductor be capable of withstanding temperatures of between 100° C. and 200° C.

The electronic cooling elements 26 are elements that utilize the Peltier effect in which heat is absorbed or radiated when an electric current is passed. The heat-absorbing side of the element is bonded integrally to the thermal conductor 25.

For this reason, the heat generated by the light emitting film structure LT that is conveyed to the thermal conductor 25 is absorbed by the electronic cooling element 26, and is then radiated away from the opposite side. The heat-radiating side of the electronic cooling element 26 may operate by natural heat radiation, but it is preferable that the heat be radiated away more aggressively by attaching a heat sink (not shown). Heat-radiating fins, for example, are good for this purpose.

It is even more preferable, however, that a radiating-fin cooling fan (which may be a small fan) be provided in back of the heat-radiating fins. This may be implemented either by providing individual heat-dissipating fans for each radiating fin unit, or by providing a heat-dissipating fan somewhere inside the cabinet for the purpose of creating air convection within the cabinet.

The operational effectiveness of this embodiment is now described. The light that is emitted from the red, green, and blue light emitting units 13R, 13G, and 13B strikes the liquid crystal panels 12R, 12G, and 12B that are positioned in opposition for each color, respectively. This incident light illuminates the liquid crystal panels 12R, 12G, and 12B which display red, green, and blue images. The image display light leaving the liquid crystal panels 12R, 12G, and 12B enters the dichroic prism 15 and is combined. This combined light is magnified 10 times, for example, by the projection lens 16. This magnified light is projected onto the transmissive screen 17. In this manner, a color image having a diagonal size of 330 mm (13 inches), for example, is displayed on the screen 17.

The heat that is radiated from the light emitting film structures LT of the light emitting units 13R, 13G, and 13B during this display is conveyed to the cooling bodies 26 via the sealing substrates 24 and the thermal conductors 25. At the cooling bodies 26, the heat conducted thereto is absorbed, radiated, and dissipated. Thus, with this active cooling, almost all of the heat produced in the light emitting film structures LT, that is, in the light emitting layers 22, is dissipated to the outside, without accumulating in the light emitting units 13R, 13G, and 13B.

That being so, degradation of light emitting performance in the light emitting layers 22 due to heat generation is suppressed, and the useful life of the light source is lengthened. The brightness of the display screen is also maintained at high levels, so that stable, bright pictures are produced.

Furthermore, a projection display apparatus is provided that can be practically implemented, wherewith the difficulties associated with the prior art are overcome while enjoying the advantages of lighter weight and smaller size afforded by mounting the light emitting units employing organic EL elements, together with their cooling bodies, and using the organic EL elements as light sources.

Also, the light emitting units are not limited to emitting only the specific colors of red-, green, and blue, as described in the foregoing. They may also commonly carry light emitting layers that emit a combination of red, green, and blue light, or light emitting layers that emit white light containing these three primary colors. In such cases, in the configuration diagrammed in FIG. 1, one only need insert separate wavelength filters that transmit only red, green, or blue, between the dichroic prism 15 and the respective liquid crystal panels 12R, 12G, and 12B.

It is also possible combine one liquid crystal panel wherein is formed red, green, and blue color filters for each pixel together with one light emitting unit having an organic EL element structure that emits white light and a projection lens.

It is also possible to implement a projector structure which uses a reflective screen having a size of 100 inches or so instead of the transmissive screen. When a reflective screen is used, the images cast on the screen are viewed from the same side as the projector.

A second embodiment is now described with reference to FIGS. 4 and 5. As with the embodiment described in the foregoing, this embodiment involves the cooling of light emitting units which employ organic EL elements. Configurational elements that are the same as or similar to those described for the first embodiment are denoted by the same reference characters, and the description thereof is either omitted or abridged. (The same applies to descriptions for the third and subsequent embodiments herein.)

Figure 4:
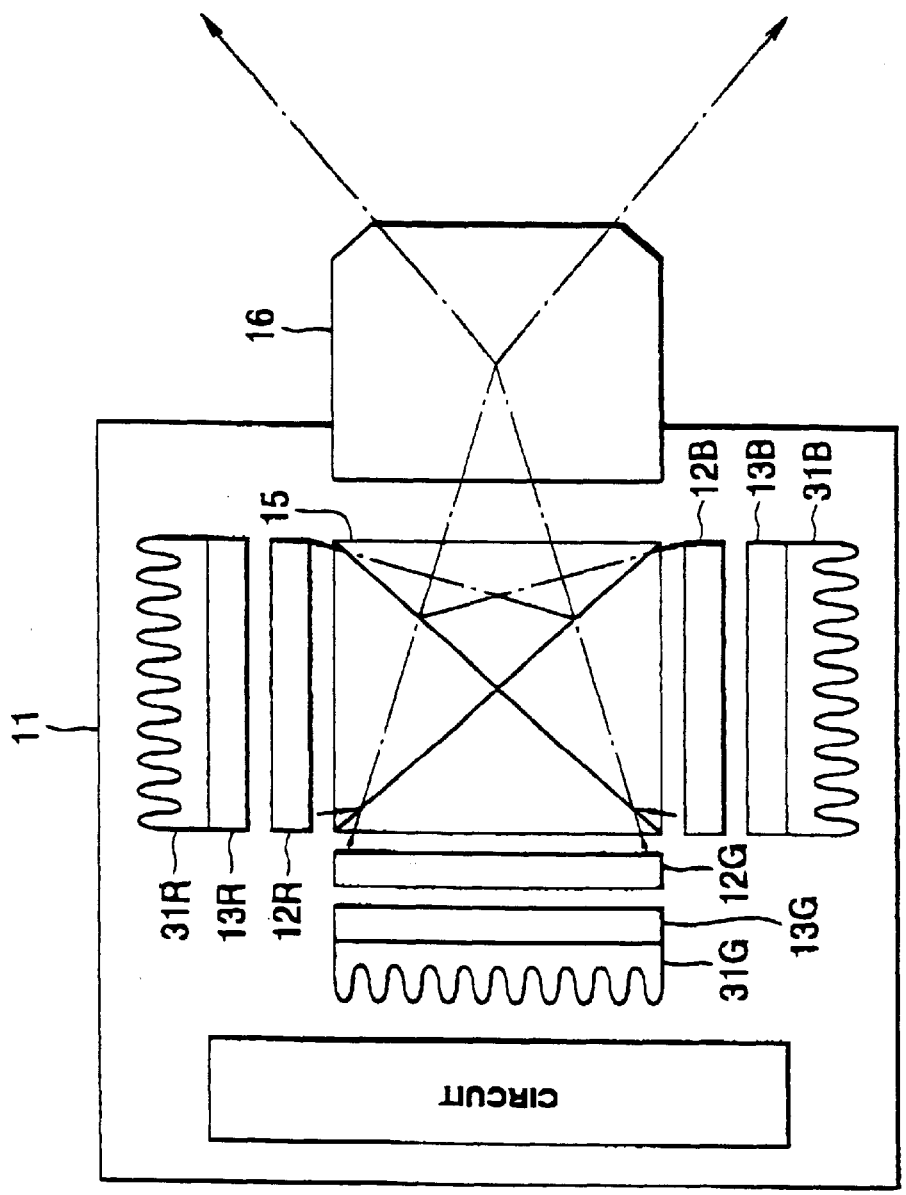
FIG. 4 in a simplified plan of a liquid crystal projector that concerns a second embodiment of the present invention.
Figure 5:
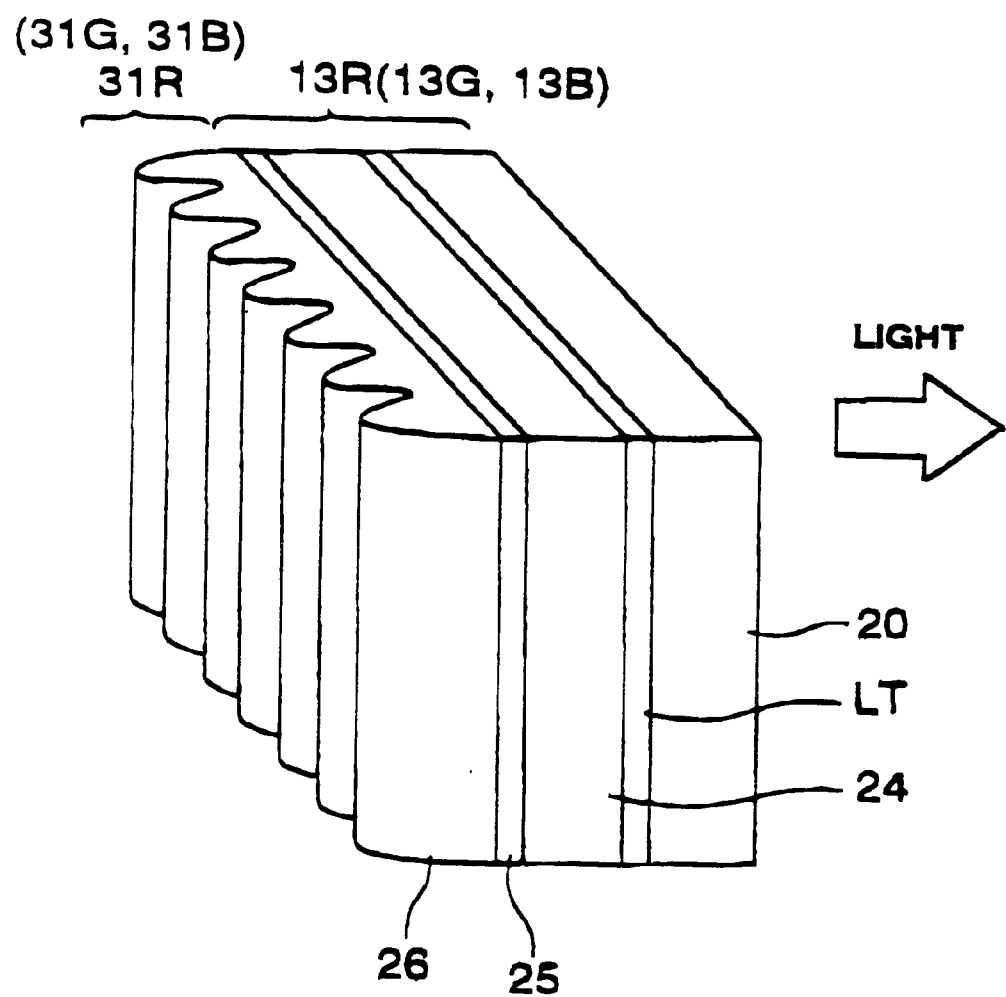
FIG. 5 in a diagram showing how a cooling body is attached as cooling means to a light emitting unit.

The liquid crystal projector diagrammed in FIG. 4 is configured as a rear-projecting triple liquid crystal projector. This projector differs from the liquid crystal projector of the first embodiment in that the cooling means for the light emitting units 13R, 13G, and 13B, in which organic EL elements are employed, are different. Whereas electronic cooling elements were used in the first embodiment, cooling bodies that employ heat-radiating fins are used in this embodiment.

To the back surfaces of the light emitting units 13R, 13G, and 13B are bonded cooling bodies 31R, 31G, and 31B, respectively, as naturally radiating cooling means. Each of the cooling bodies 31R, 31G, and 31B is provided with a thermal conductor 25 formed on a sealing substrate 24, and a radiating fin unit 32 is bonded to the thermal conductor 25, as diagrammed in FIG. 5.

The radiating fin unit 32 is formed of a substance such as aluminum which is a good conductor of heat. In addition, the side of the radiating fin unit 32 opposite the thermal conductor 25, that is, the heat-radiating surface, has vertically oriented undulations (in the vertical dimension of the radiating fin units 32 in FIG. 5) consisting of a plurality of peaks and valleys formed therein so that the cross-section thereof takes on a wave form. It in preferable that a heat-dispersing fan such as was described for the first embodiment be provided, either at the back of the radiating fins or somewhere in the cabinet 11.

Thus heat released from the light emitting film structure LT will be conveyed to the radiating fin unit 32 via the sealing substrate 24 and the thermal conductor 25, and will be dissipated by natural radiation from the heat-radiating surface thereof. As a result, cooling will be effected in this second embodiment also so as to effectively suppress the accumulation of heat generated by the light emitting units 13R, 13G, and 13B. Furthermore, in this case, because the cooling means are radiating fine, there is no need to employ an electric current, as with the electronic cooling elements, thus affording the advantage of being able to make the power supply circuit smaller.

Figure 6:
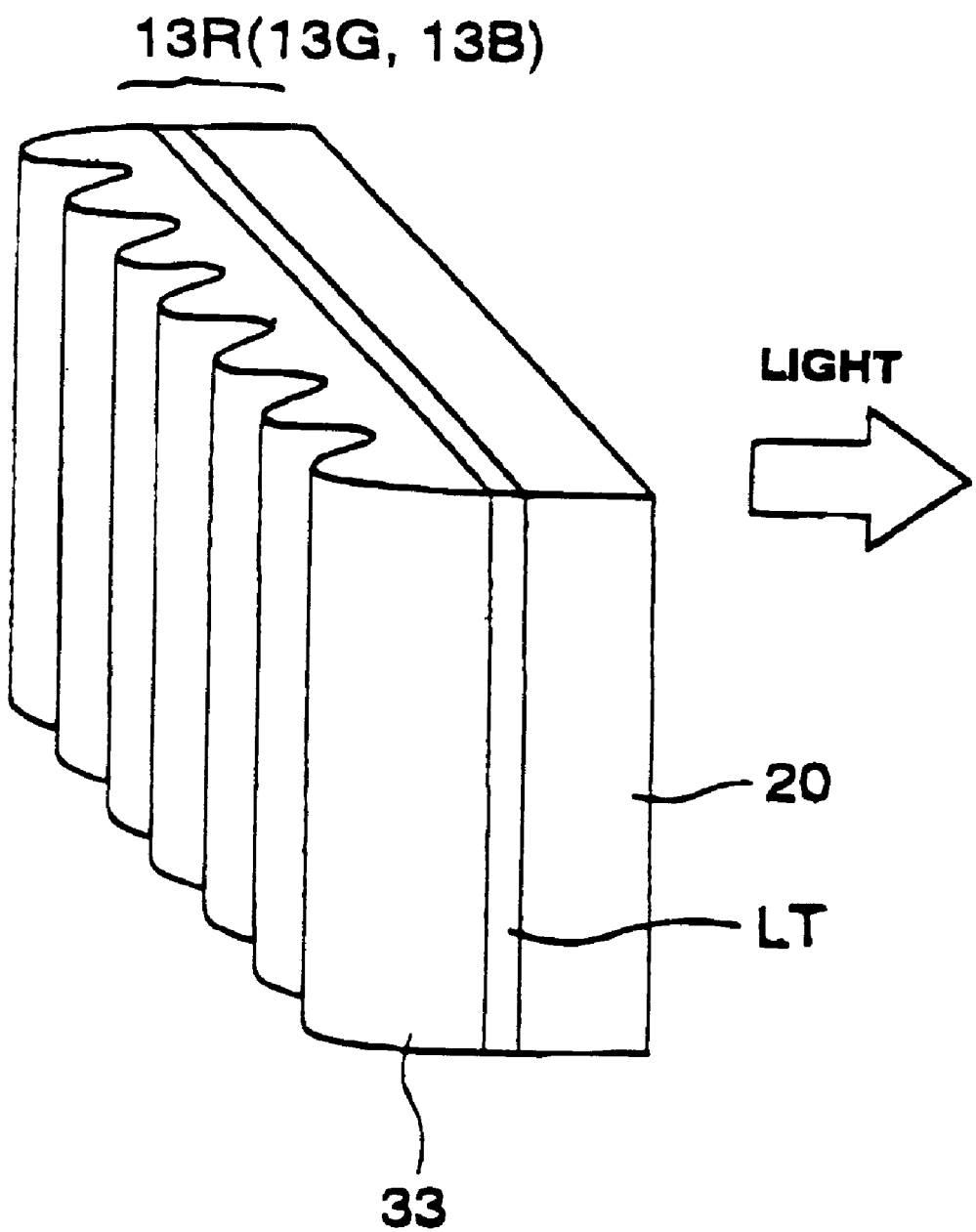
FIG. 6 is a diagram showing how another cooling body is attached to a light emitting unit.
Figure 7:
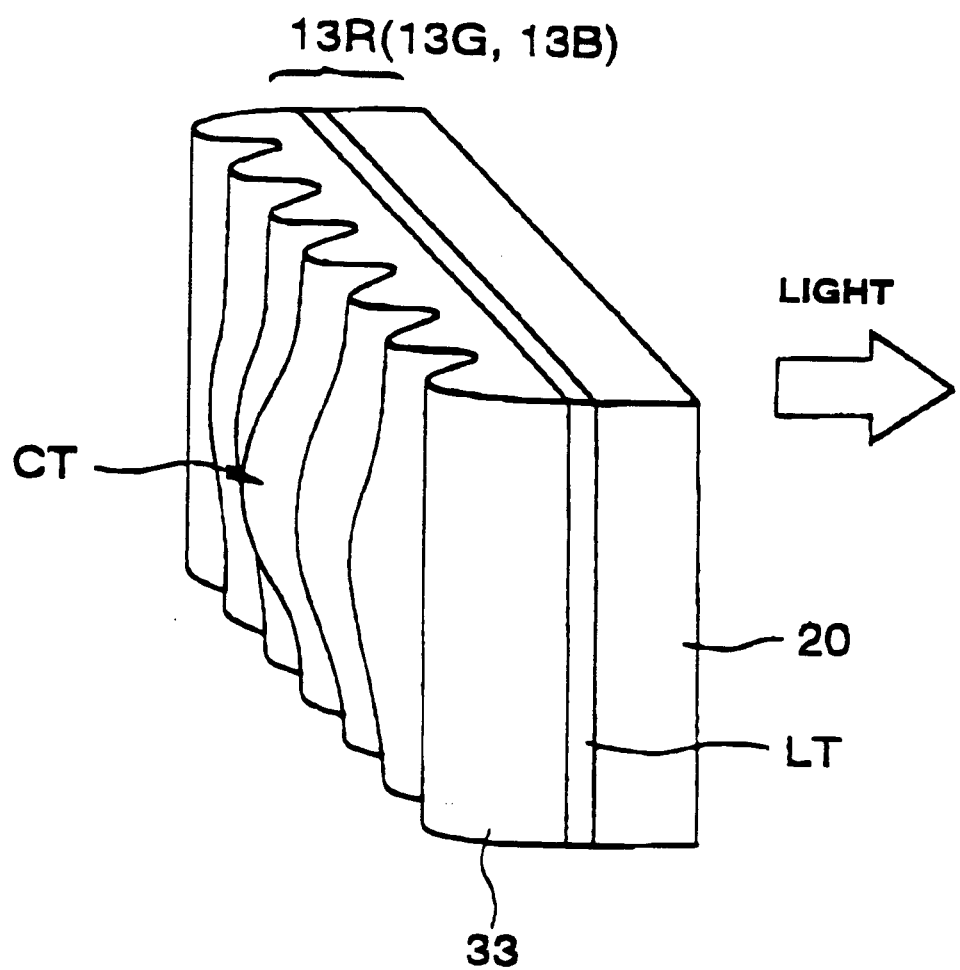
FIG. 7 is a diagram showing how yet another cooling body is attached to a light emitting unit.

Various modifications are possible in the shapes of the cooling bodies 31R, 31G, and 31B pertaining to the second embodiment, as described in the foregoing, as are depicted in FIGS. 6 and 7, for example. The cooling body depicted in FIG. 6 integrates three of the members described above, namely the radiating fins, thermal conductor, and sealing substrate, thus forming a sealing substrate 33 that is equipped with radiating fins. This permits a more compact configuration.

The cooling-body depicted in FIG. 7 also integrates the three members, that is, the radiating fins, thermal conductor, and sealing substrate, as in the configuration depicted in FIG. 6, yielding a sealing substrate 33 that is equipped with radiating fins, but having the center portion CT of the heat-radiating surface of the radiating fin unit mounded toward the outside, so as to gain extra surface area, while retaining the waveform shape. The purpose of this configuration is to further enhance cooling at the center of the surface of the planar light emitting layer formed by the organic EL element, where the level of heat generated is known to be higher.

Figure 8:
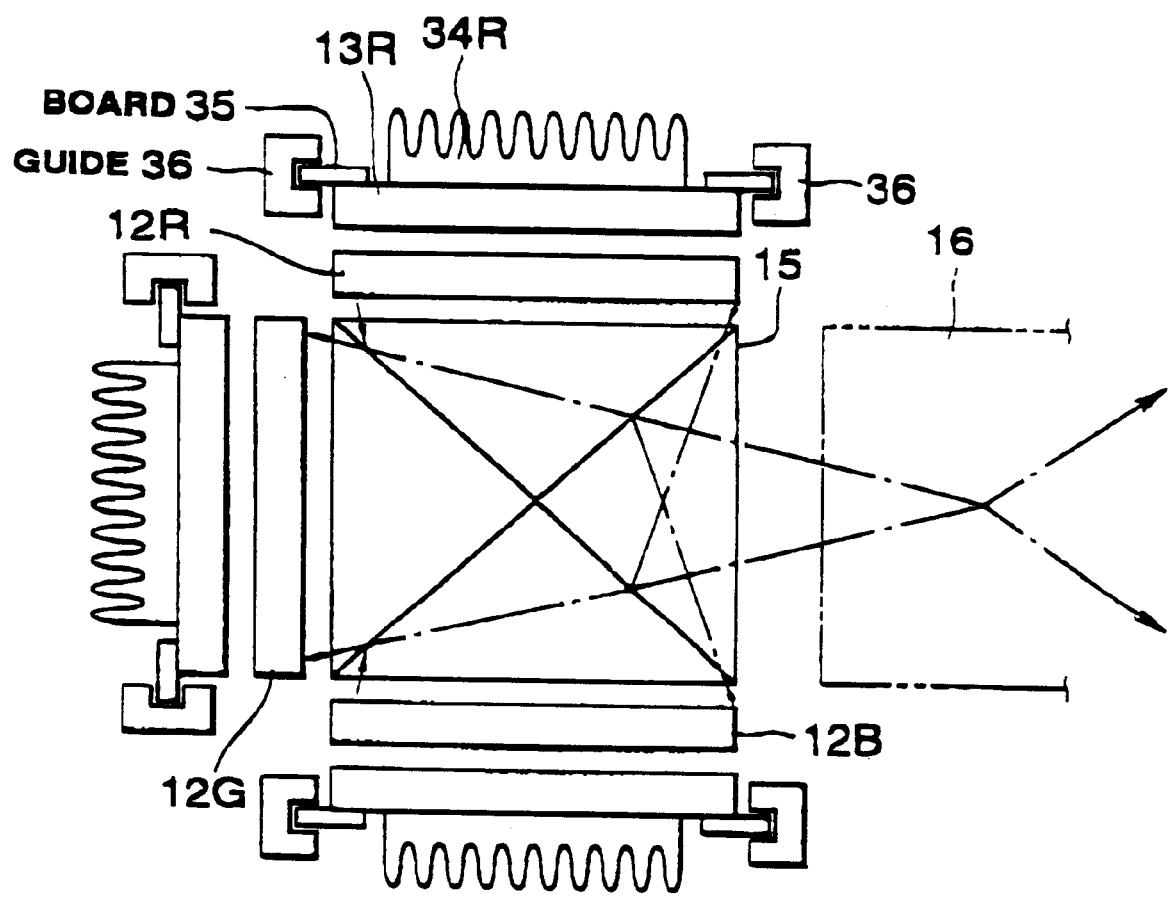
FIG. 8 is a simplified partial plan of a liquid crystal projector that concerns a third embodiment of the present invention.
Figure 10:
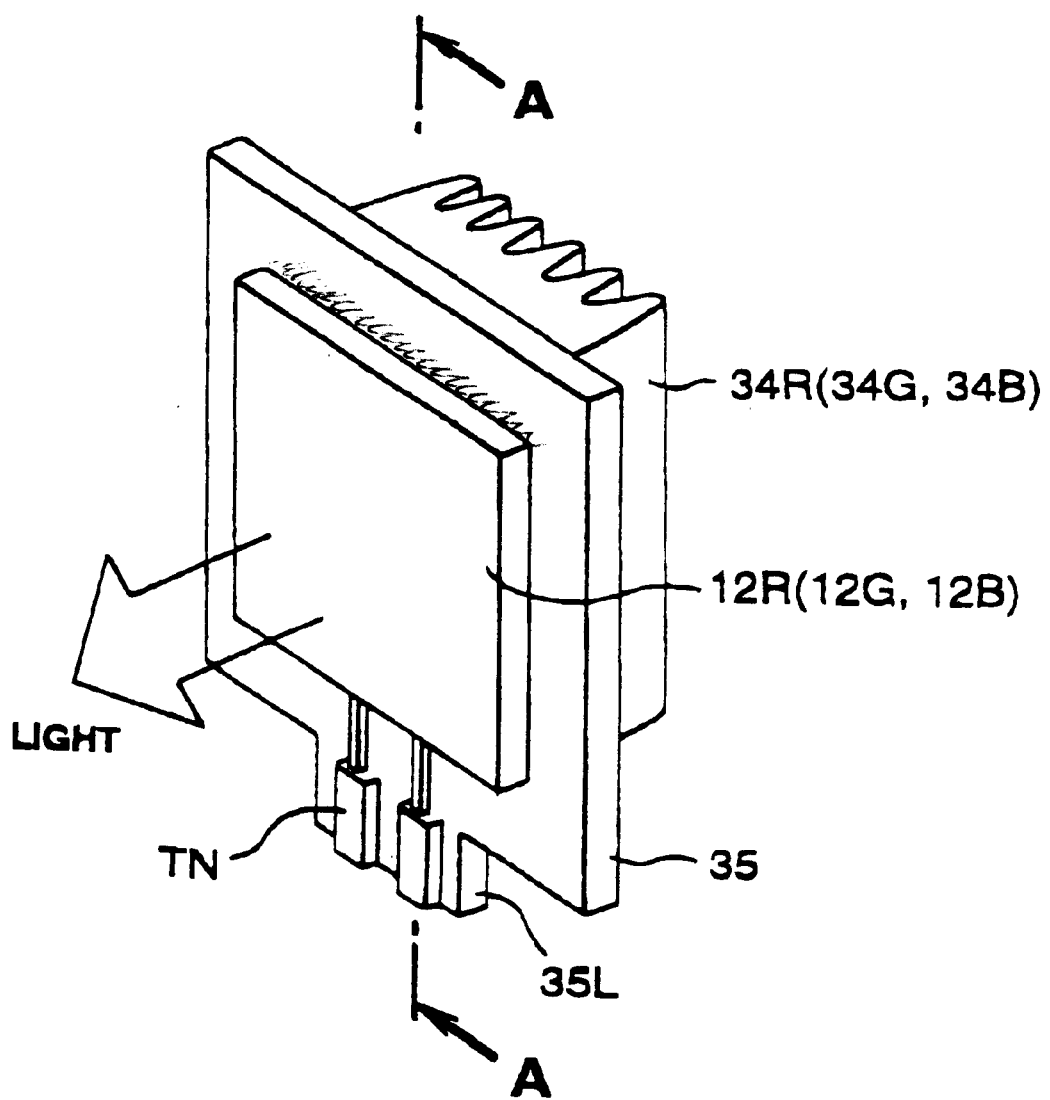
FIG. 10 is a diagonal view that depicts a light emitting unit structured so that it is can be replaced.
Figure 11:
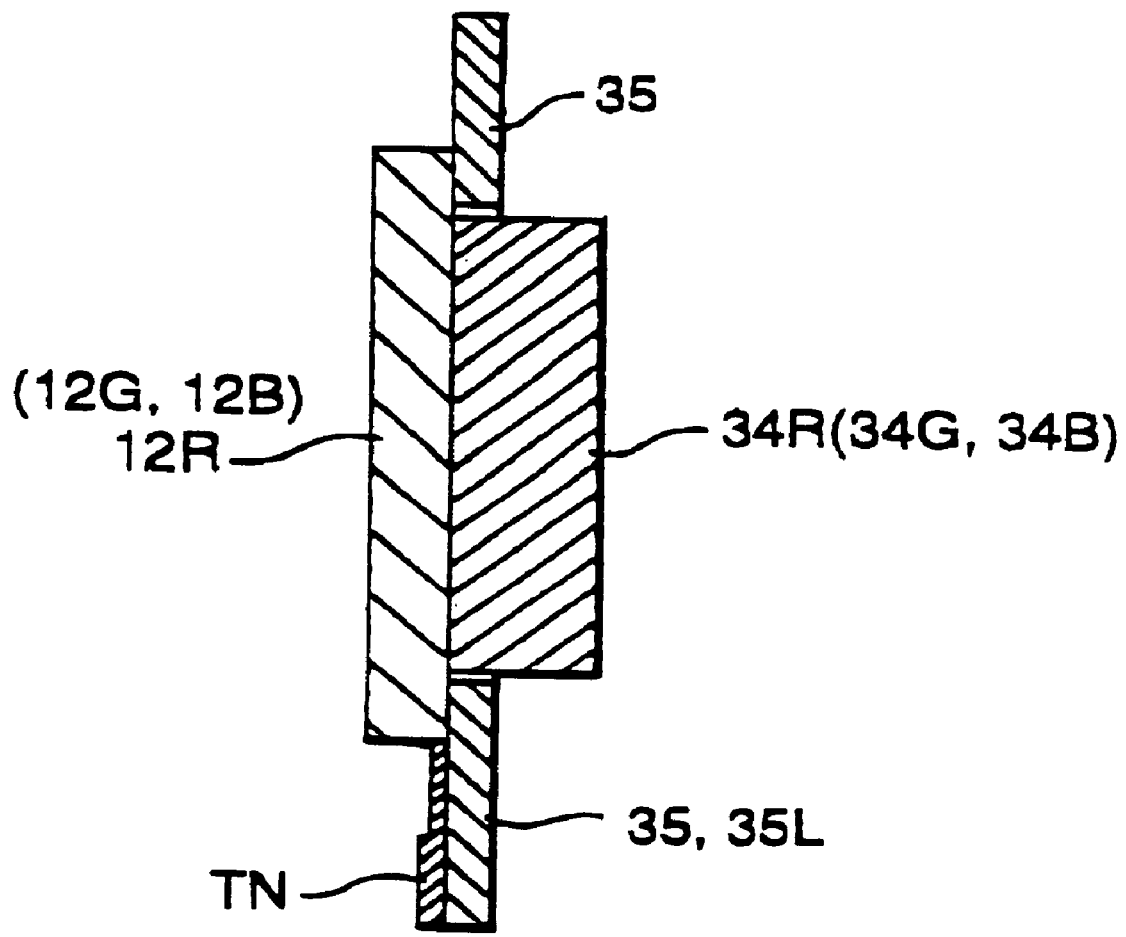
FIG. 11 is a simplified cross-sectional view in the A—A plane of FIG. 10.

A third embodiment is now described with reference to FIGS. 8 through 11. This embodiment pertains to a replacement structure for light emitting units using organic EL elements. The liquid crystal projector diagramed in FIG. 8 is configured as a rear-projecting triple liquid crystal projector. It comprises three liquid crystal panels 12R, 12G, and 12B, at the back of each of which is provided a light emitting unit 13R (13G, 13B) that can be freely attached or detached, to the back of which light emitting unit 13R a cooling body 34R (34G, 34B) is integrally bonded. This cooling body 34R (34G, 34B) is configured as described above with reference to FIG. 6, except that the size of the bonded area is formed 60 as to be slightly smaller than the area of the back surface of the light emitting unit 13R (13G, 13B). Around the edge that remains on the back side of the light emitting unit 13R (13G, 13B) is bonded a board 35, as depicted in FIGS. 8, 10, and 11. This board 35 functions as a guided member during installation or replacement, as will be described below, and it also functions through its lower edge to make an electrical connection with the power supply circuit.

This liquid crystal projector also comprises pairs of concave guides 36 and 36 that are positioned on a base (not shown), in mutual opposition, for the purpose of guiding the boards 35, that is, the sets consisting of a light emitting unit and a cooling body, in the vertical direction. The positions of these guides 36 and 36 on the base are established so that, when a board is plugged in, the light emitting unit 13R (13G, 13B) is positioned accurately in proximity to the back side of the liquid crystal panel 12R (12G, 12B), and so that the optical axis from the light emitting unit to the liquid crystal panel is accurately established and made straight.

Figure 9:
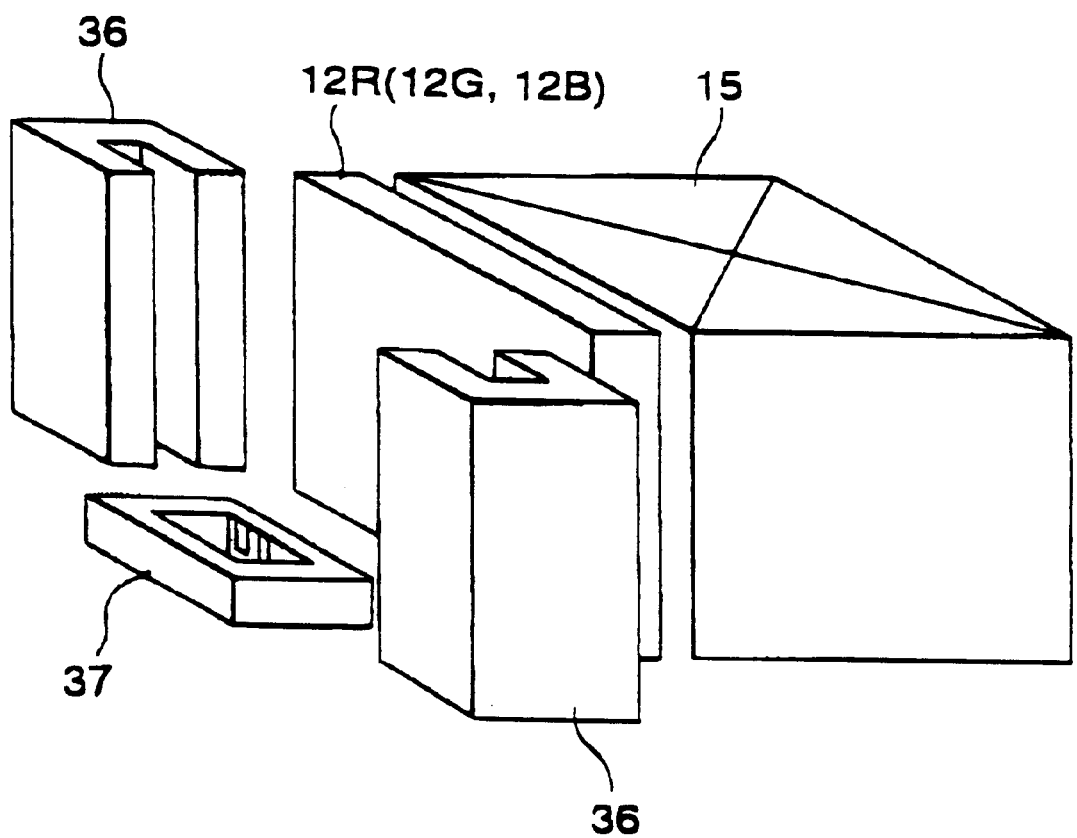
FIG. 9 is a diagonal view that depicts the guide and connector parts of FIG. 8.

At positions on the base that are between each pair of guides 36 and 36 are provided connectors 37, as depicted in FIG. 9. The configuration allows a plug 35L (cf. FIGS. 10 and 11) formed integrally in the lower end of each of the boards 35 to be inserted into the connector 37, so that it can be freely advanced or retracted. On one side of the plug 35L is mounted a terminal TN comprising a printed circuit for signal and power transmissions to the light emitting unit 13R (13G, 13B). Hence, when a base 35 (that is, a combination of a light emitting unit and a cooling body) is plugged into the connector 37 while guided by the guides 36 and 36, electric power and signal circuits (not shown) are electrically connected to the light emitting unit 13R (13G, 13B). Other than this, the configuration and functionality are similar to those of the embodiments described earlier.

Thus when it is judged that the light-emitting performance of a light emitting unit 13R, 13G, or 13B has fallen below allowable limits, and that its useful life has expired, or when maintenance or inspections are performed, any individual light emitting unit can be readily replaced. During replacement, only the old light emitting unit is pulled out, together with its board 35, and a new light emitting unit can be smoothly plugged in using the guide functions of the board 35 and the guides 36 and 36. Hence each light emitting unit can be easily replaced, maintenance and inspection tasks are made less tedious and time-consuming, and any light emitting unit can be replaced individually, which contributes to reducing maintenance and inspection costs as well as component costs.

In particular, in a color-displaying triple liquid crystal projector, wherein light emitting units are installed in each of the three liquid crystal projectors, the number thereof becomes large. By being able to make replacements easily, however, one may avoid or reduce the number of occasions of unstable or poor display quality when projectors are driven despite a breakdown in display color balance.

Electrical connections with the light emitting units are safely secured after replacement, of course, and, thanks to the accurate guidance of the guides 36 and 36, light emitting units are easily and accurately restored to their proper optical positions after replacement. The orientation and positioning of the replaced light emitting units are not altered from what they were prior to replacement, so the way in which light is incident on the liquid crystal panels is also unaltered, making it possible to effect high display quality and stability.

In addition, the shapes of the boards that serve as guided members and the guiding members described in the foregoing, as well as the way these are put together, can be variously altered within the scope of the intent of the present invention.

A fourth embodiment is now described with reference to FIGS. 12 and 13. This embodiment concerns an improvement in the directionality of the light emissions from the light emitting units in which organic EL elements are used.

Figure 12:
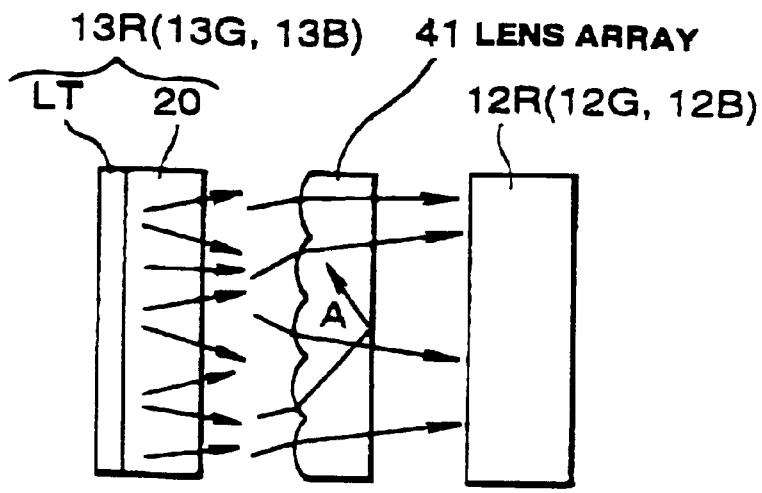
FIG. 12 is a simplified plan of the vicinity of a light emitting unit in a liquid crystal projector that concerns a fourth embodiment of the present invention.
Figure 13:
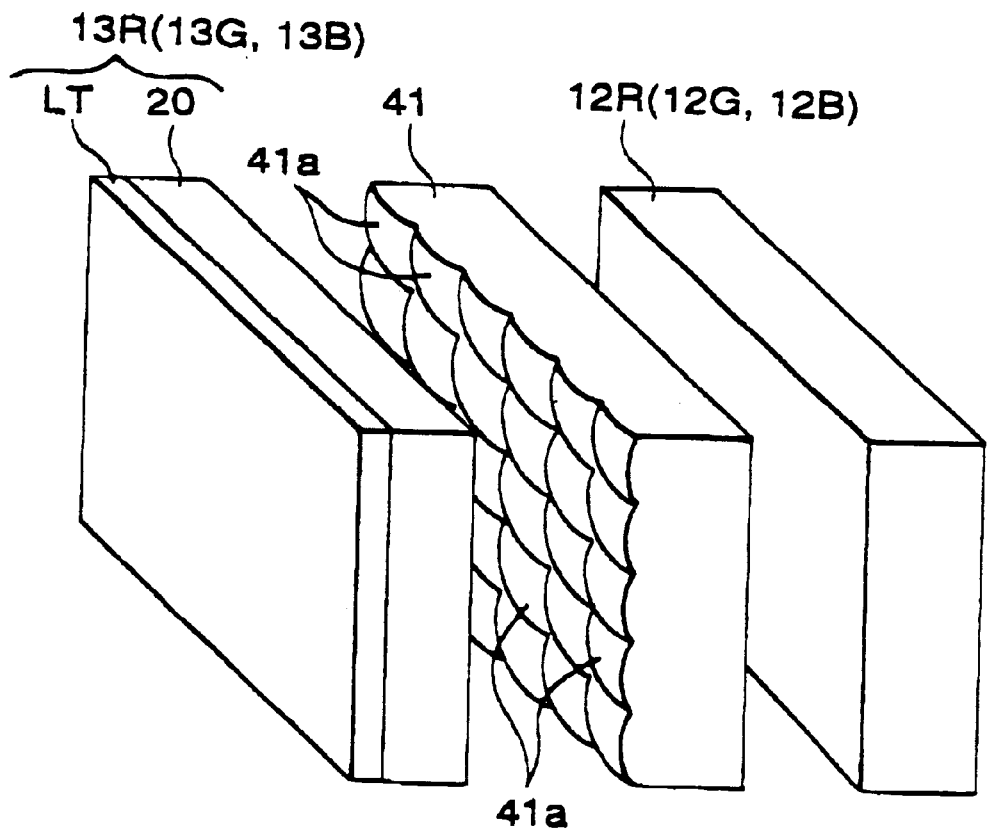
FIG. 13 is a simplified diagonal view of the configuration in FIG. 12.

The liquid crystal projector to which this embodiment pertains employs the optical arrangement diagrammed in FIGS. 12 and 13. This optical arrangement may be employed in a triple liquid crystal projector such as described in the foregoing, or it may be employed in a single liquid crystal projector. According to the optical arrangement diagrammed in FIGS. 12 and 13, a lens array 41 is interposed, as directionality regulating means, between the liquid crystal panel 12R (12G, 12B) and the light emitting unit 13R (13G, 13B) that employs an organic EL element. A plurality of microlenses 41a is formed two-dimensionally on the light-incident side of the lens array 41, which is to say on the incident surface on the side of the light emitting unit. This plurality of microlenses 41a is formed such that the pitch therein, respectively, is in a ratio of 4.5:1 relative to the pixel pitch in the liquid crystal panel 12R (12G, 12B), and the array is optimized so that moire either does not occur or is not prominent and is exceedingly fine.

To express this quantitatively, if the focal length of the microlens is approximately 1 mm, roughly coinciding with the light emitting layer of the light emitting units, and the pixels in the liquid crystal panel are of a size P (where P=33 $\mu$m, for example), then the radius of curvature of the microlenses 41a should be approximately 500 $\mu$m, and the lens pitch should be 4.5 P (150 $\mu$m, for example); that is to say, a curvature and lens pitch in this neighborhood are desirable. For this reason, the light emitted from the light emitting unit 13R (13G, 13B), used as a planar light source, will contain a considerable quantity of randomly oriented light components. The directionality of these light components is regulated by the microlenses 41a of the lens array 41, however, and ideally most of them strike the liquid crystal panel 12R (12G, 12B) as more or less parallel light beams. Accordingly, most of the light emitted from the light emitting unit 13R (13G, 13B) will be incident on the liquid crystal panel 12R (12G, 12B) with good efficiency and little waste. This prevents degradation in the brightness of the display screen. Looking at this from another angle, by the measure that light strikes the liquid crystal panels with parallel directionality and good efficiency, the less light-emitting power will be needed in the organic EL elements, which means precisely that degradation in light-emitting performance due to heat generation, which is to say the shortening of their useful life, can be prevented.

Furthermore, among the light emitted from the light emitting unit 13R (13G, 13B) or the light incident upon the lens array 41, there will be some portion of the light components (cf. arrow a in FIG. 12) that will be totally reflected by the surface of the lens array 41, either on the light-incident side or the light-emission side, due to the contribution of the microlenses 41a.

When these totally reflected light components return to the light emitting unit 13R (13G, 13B), they are reflected in turn by the reflective electrode layer of the light emitting unit, and thus recycled as light that is incident upon the lens array 41. For this reason, the deployment of the lens array 41 also further enhances the efficiency with which the light emitted from the light emitting unit is utilized.

Figure 14:
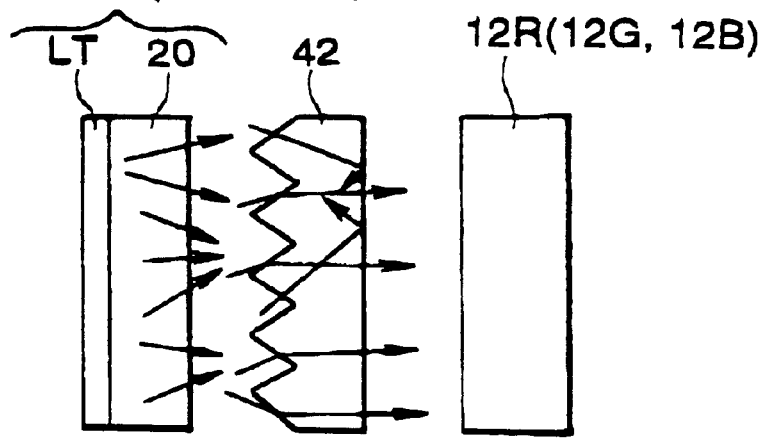
FIG. 14 is a simplified plan of the configuration in the vicinity of a light emitting unit in a modification of the fourth embodiment of the present invention.
Figure 15:
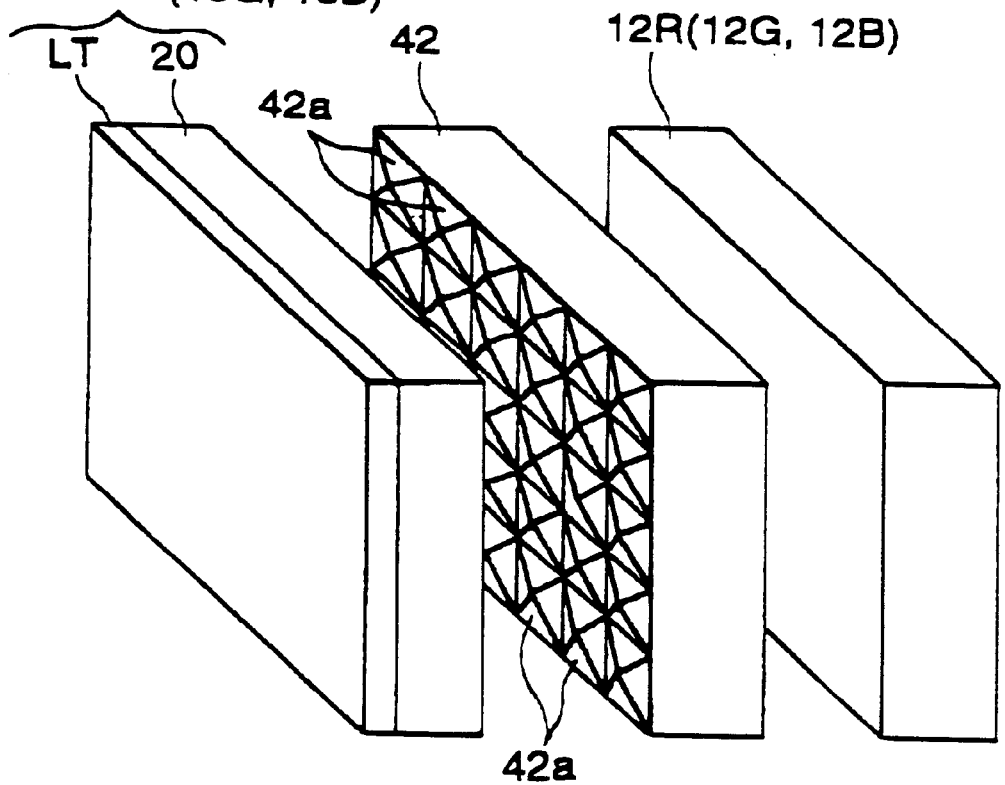
FIG. 15 is a simplified diagonal view of the configuration in FIG. 14.

A modified form of this fourth embodiment is diagrammed in FIGS. 14 and 15. With the optical arrangement employed in this modified form, a prism array 41 is interposed as directionality regulating means, as diagrammed, instead of a lens array. This prism array 42 has a plurality of microprisms 42a formed two-dimensionally on its incident side. As with the lens array, it is desirable that the size, height to apex, and pitch, etc., of the microprisms 42a be established so that there is very little total reflection of incident light by the boundary surfaces thereof, and so that, to the extent possible, parallel light is emitted toward the liquid crystal panels. By these means the operational effectiveness gained is similar to what is gained when the lens array described earlier is used.

A fifth embodiment will now be described, with reference to FIGS. 16 and 17. This embodiment concerns improving the efficiency of light emissions from light emitting units using organic EL elements.

Figure 16:
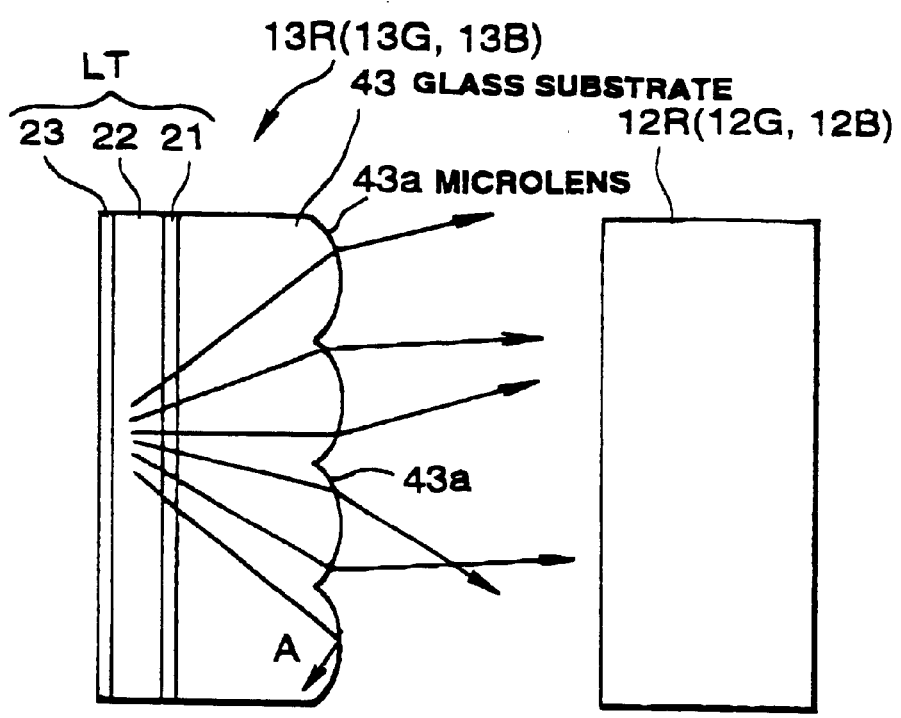
FIG. 16 is a simplified diagram of the configuration in the vicinity of a light emitting unit in a liquid crystal projector that concerns a fifth embodiment of the present invention.

The liquid crystal projector to which this embodiment pertains employs the light emitting unit diagrammed in FIG. 16. This light emitting unit may be employed in a triple liquid crystal projector, or it may be employed in a single liquid crystal projector.

The light emitting unit diagrammed in FIG. 16 comprises a glass substrate 43 as the transparent substrate, a light emitting film structure LT (consisting of a transparent electrode layer 21, a light emitting layer 22, and a reflective electrode layer 23) laminated on the glass substrate 43. In this configuration, on the emission surface on the light-emission side of the glass substrate 43 is formed a lens array structure in which multiple dome-shaped lenses 43a are arranged two-dimensionally. The pitch of this multiple lens array is optimized so that it is extremely fine, and so that the emitted light is emitted, to the extent possible, without complete reflection (cf. arrow A in the figure). To express this quantitatively, when in the lens array structure the thickness of the glass substrate 43 is 1 mm and the pixel pitch for the liquid crystal panel is P (where P=33 $\mu$m, for example), the radius of curvature of the lens 43a should be 330 $\mu$m and the lens pitch 4.5 P (150 $\mu$m, for example); that is to say, a curvature and lens pitch in this neighborhood are desirable.

Figure 17:
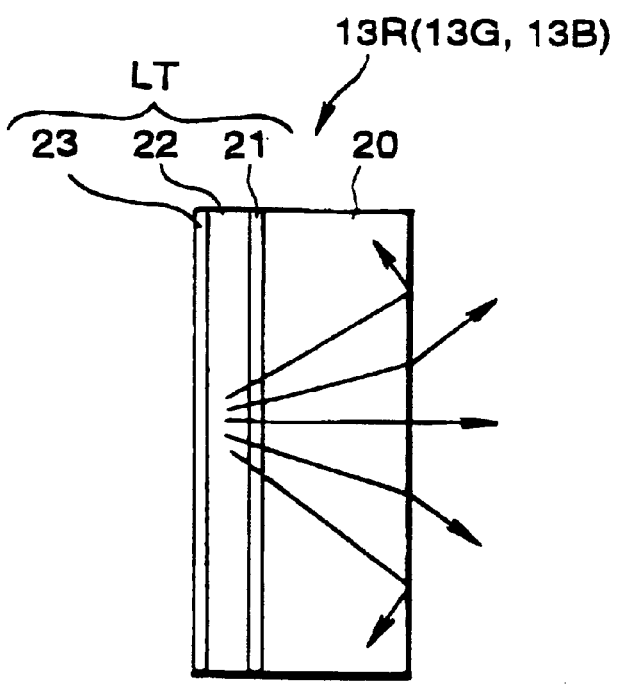
FIG. 17 in a simplified diagram of the configuration of a light emitting unit provided without a lens array, which contrasts with FIG. 16.

Hence, with this lens array structure, for the light emitted with the entirety of the light emitting layer 22 as a planar light source (the way in which light is emitted is represented only in part in FIG. 16, for the sake of clarity), there will be little total reflection over the whole surface, as compared to the case of a glass substrate 20 having a flat light-incident surface as diagrammed in FIG. 17. In other words, the efficiency with which light is emitted toward the liquid crystal panel 12R (12G, 12S) will be sharply increased. Hence there will be less waste in the light that is emitted, brightness will be high, a bright screen picture is obtained, and display quality can be enhanced.

It is also conceivable to form one large dome-shaped lens over the entire light-emission surface of the glass substrate 43 in FIG. 16. That would be disadvantageous, however, in that the substrate would become quite thick at the middle of the substrate surface, without total reflection being all that much reduced. Thus the lens array structure described above is more suitable to the present invention.

Figure 18:
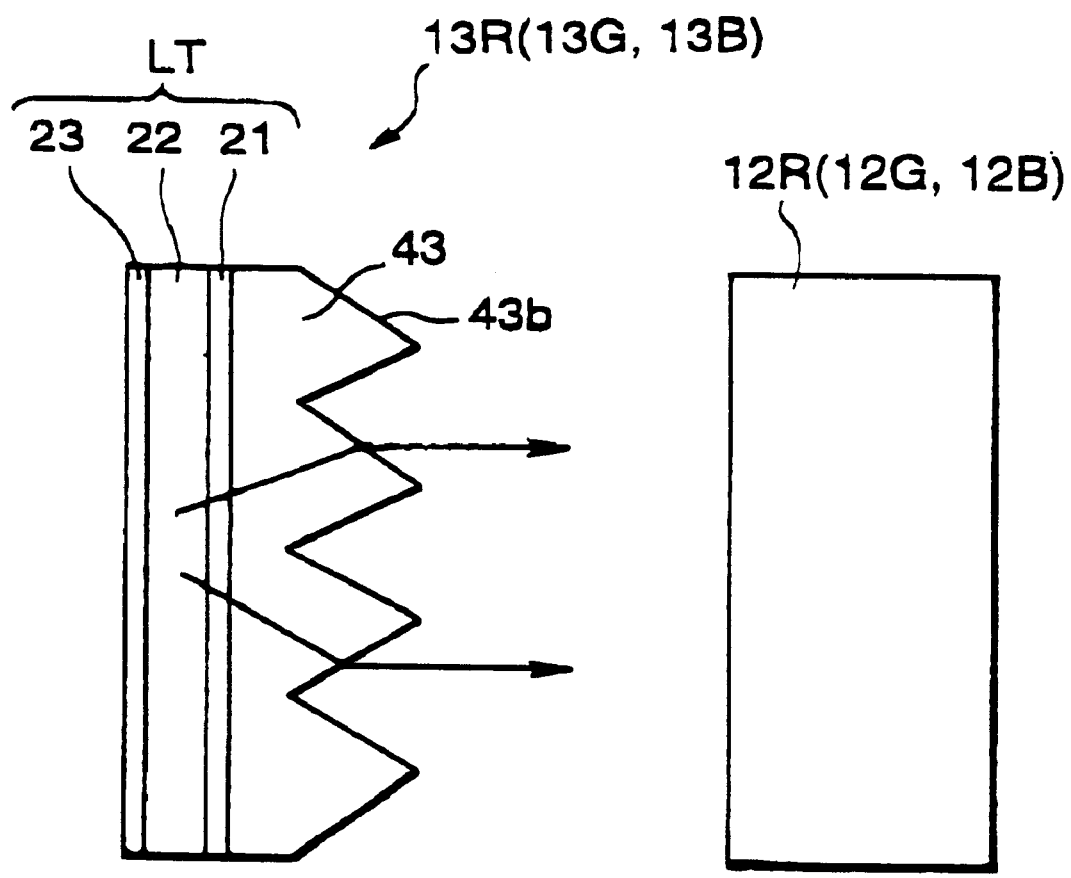
FIG. 18 is a simplified diagram of a microprism array that represents a modification of the fifth embodiment of the present invention.

A modified form of this fifth embodiment is diagrammed in FIG. 18. In this modified form, a microprism array 43b is employed instead of the microlens array 43a. The light emitting unit in this modified form also comprises a glass substrate 43 as the transparent substrate, and a light emitting film structure LT (consisting of a transparent electrode layer 21, a light emitting layer 22, and a reflective electrode layer 23) laminated on the glass substrate 43.

In this configuration, a prism array structure in which multiple triangular prisms 43b are arranged two-dimensionally is formed on the light-emission surface on the light-emission side of the glass substrate 43. The pitch in this multiple-prism array is optimized so that it is extremely fine and so that, to the extent possible, emitted light can emerge without being totally reflected. Accordingly, the modified form of the fifth embodiment represented in FIG. 18 yields the same sort of emission efficiency as the structure diagrammed in FIG. 17.

A sixth embodiment will now be described, with reference to FIGS. 19 to 21. This embodiment concerns a projection display apparatus that comprises light emitting units which employ organic EL elements and accommodate resonator structures, and it also concerns improving thereby both the directionality of the light emitting units themselves and the spectrum waveform. In the liquid crystal projector to which this embodiment pertains, as diagrammed in FIG. 19, a light emitting unit 13R (13G, 13B) is positioned separately on the back side of the liquid crystal panel 12R (12G, 12B). The light emitting units 13R, 13G, and 13B, unlike those described earlier, comprise resonator structures, which latter have been under intense development in recent years. Examples of such resonator structures that are known include those disclosed in Technical Report OME 94-79 of the Institute of Electronics, Information and Communications Engineers (IEICE).

Figure 19:
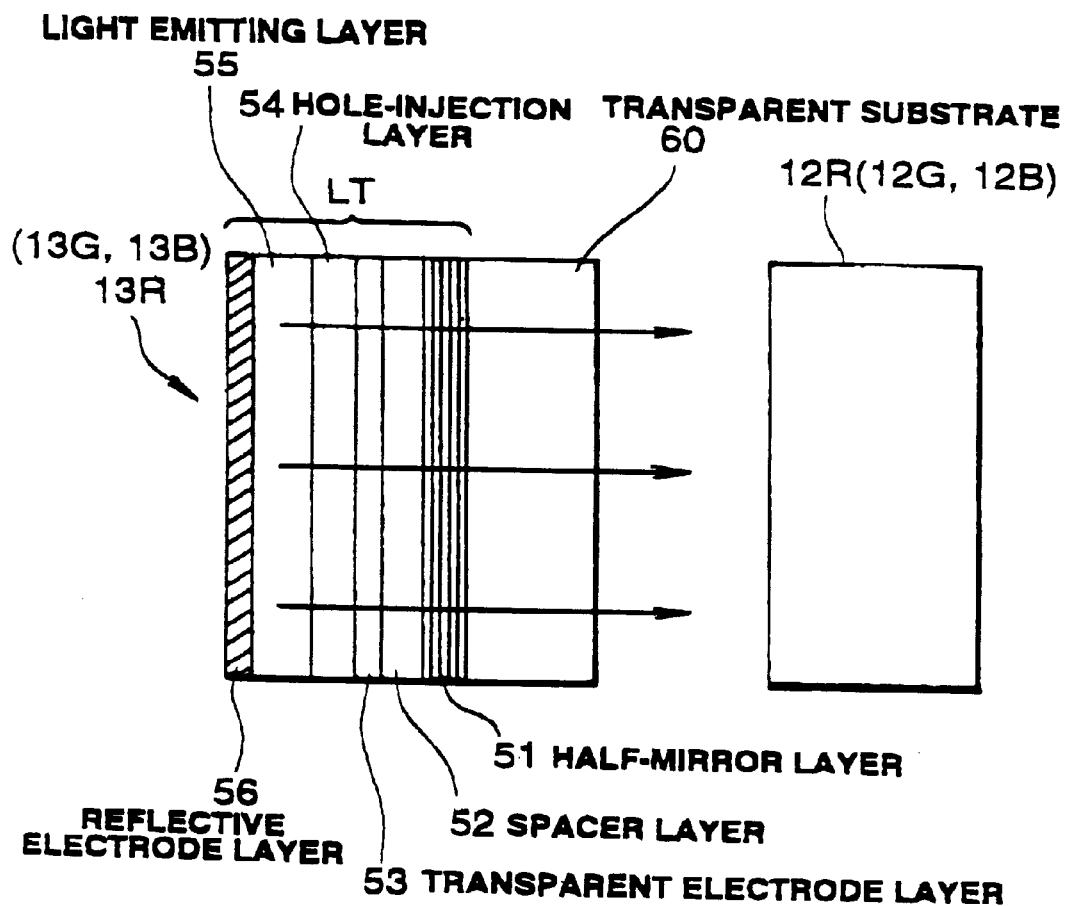
FIG. 19 is a simplified diagram of the configuration in the vicinity of a light emitting unit in a liquid crystal projector that concerns a sixth embodiment of the present invention.

More specifically, the light emitting units 13R, 13G, and 13B, respectively, are formed by laminating, onto a glass or other transparent substrate 50, a half-mirror layer 51 consisting of a dielectric multi-layer film, a spacer layer 52 consisting of a transparent dielectric film such as $SiO_2$, a transparent electrode layer 53 consisting of a transparent electrically conductive film such as ITO (indium tin oxide), a hole-injection layer 54 consisting of an organic thin film that contributes to electric-field light emission, a light emitting layer 55 consisting of an organic thin film that emits light, and a reflective electrode layer 56 consisting of a metallic film, in that order, as diagrammed in FIG. 19. In this configuration, the light emitting film structure LT is formed from the half-mirror layer 51, spacer layer 52, transparent electrode layer 53, hole-injection layer 54, light emitting layer 55, and reflective electrode layer 56.

Since a resonator is configured by the half-mirror layer 51 and the reflective electrode layer 56, only that light emitted by the light emitting-layer S5 having the wavelengths determined by the resonator length (that is, the optical distance between the half-mirror layer 51 and the reflective electrode layer 56) is resonated and emitted to the outside with good efficiency. This emitted light becomes the light that illuminates the liquid crystal panels 12R, 12G, and 12B. Almost none of the light components of other wavelengths are emitted to the outside.

The resonator length that determines the light emission wavelength in the middle of the spectrum can be changed by altering the thicknesses of the spacer layer 51 and transparent electrode layer 53. The resonator length and light emitting layer material, etc., are optimized according to which color the center light-emission wavelength is set to, that is, whether red, green, or blue.

Figure 20:
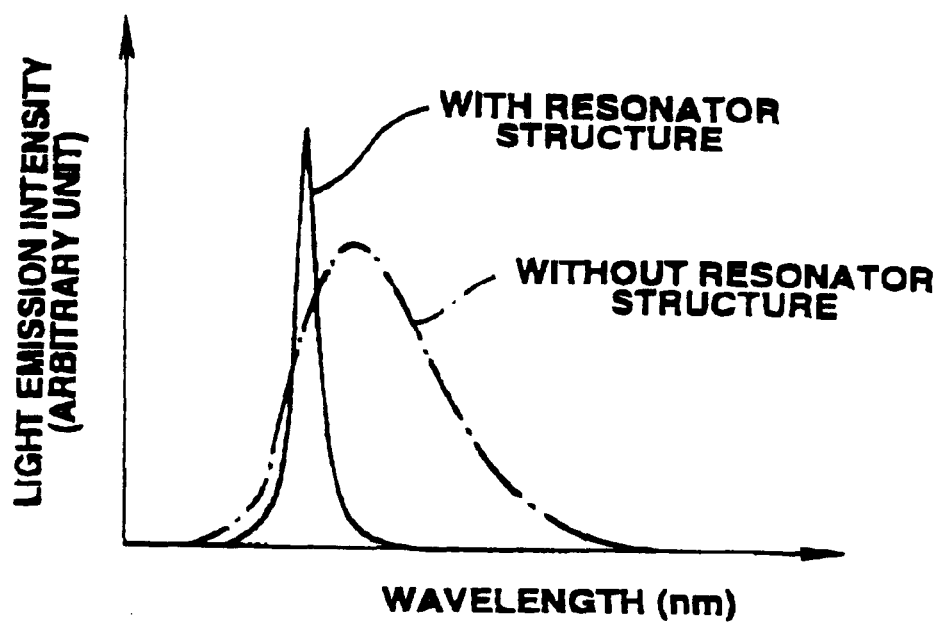
FIG. 20 is a diagram for describing differences in spectrum waveform depending on the presence or absence of a resonator structure.

In FIG. 20 are plotted spectrum waveforms obtained both when providing and when not providing the light emitting unit 13R (13G, 13B) with the resonator structure, as published in Applied Physics Letters, Vol. 68, pp. 2633–2635 (1996).

Compared to the curve "without resonator structure," the curve "with resonator structure" exhibits a narrower half band width and a sharper peak. Therefore, by employing the resonator structure in the light emitting unit 13R (13G, 13B), one can enhance the purity of the light (i.e. light of red, green, or blue color, respectively) emitted from the light emitting unit itself. Hence the quantity of superfluous wavelength components outside of the desired wavelength is reduced, and high-quality color displays are made possible.

Figure 21:
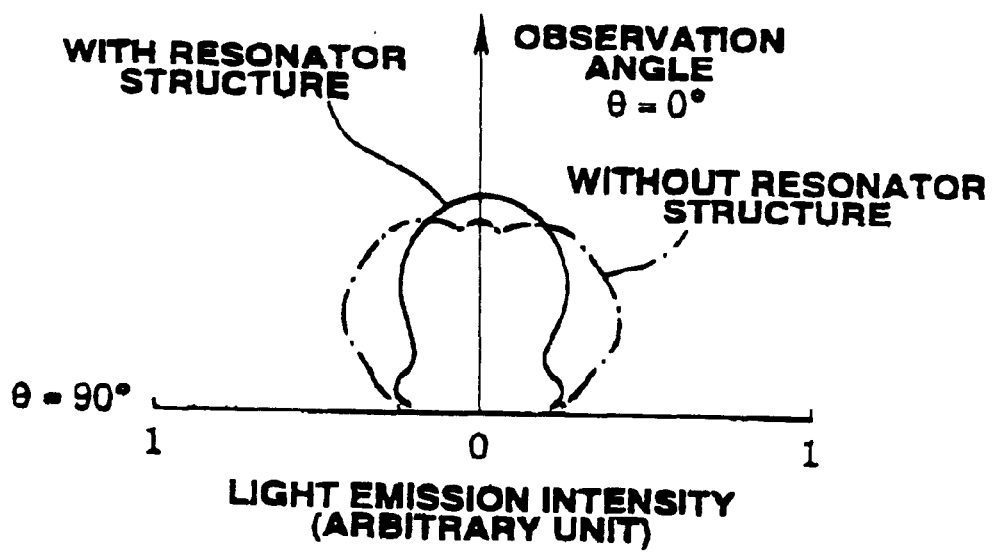
FIG. 21 is a diagram for describing differences in directionality depending on the presence or absence of a resonator structure.
Figure 22:
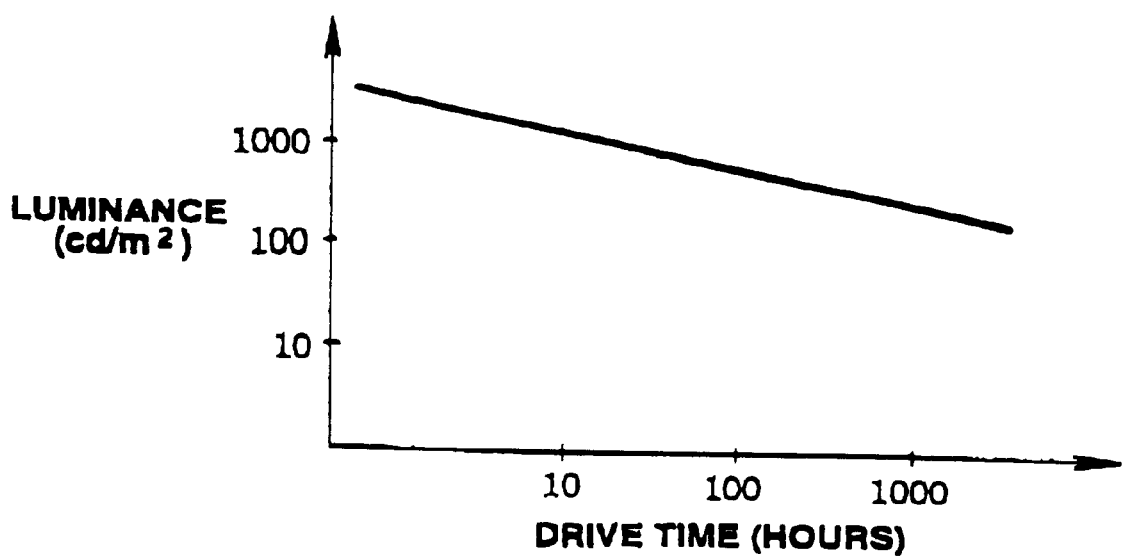
FIG. 22 is a graph that represents the relationship between brightness and accumulated drive time in a light emitting unit that has an organic EL element as its light emitting layer.
Figure 23:
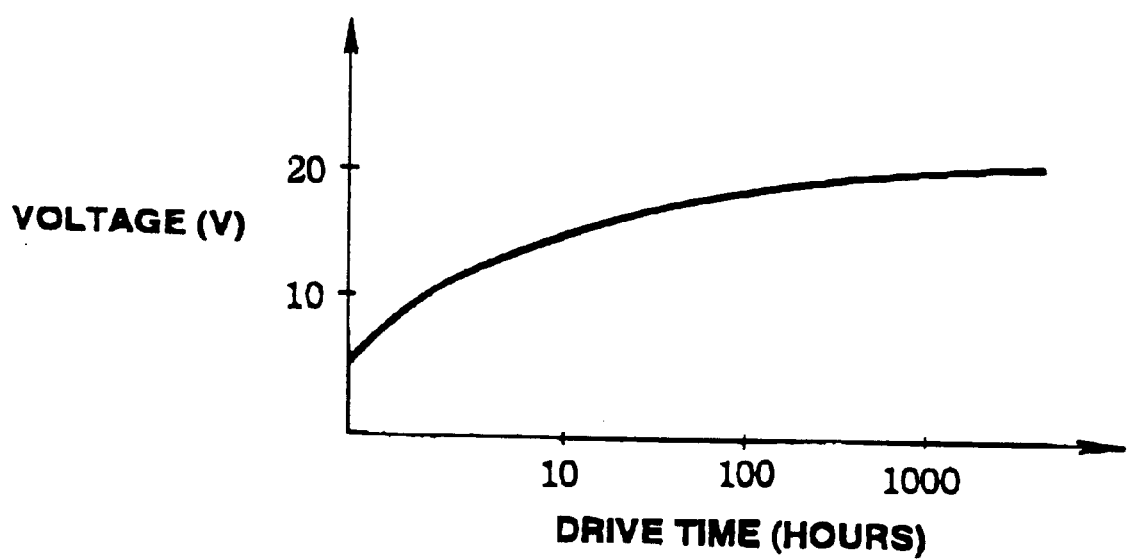
FIG. 23 is a graph that represents the relationship between terminal voltage and accumulated drive time in a light emitting unit that has an organic EL element as its light emitting layer.

FIG. 21, which appeared in the same publication, plots the directionality both when providing and when not providing the light emitting units 13R, 13G, and 13B with the resonator structure. Compared to the directionality "without resonator structure," the directionality "with resonator structure" is sharper in the direction of the front surface of the light source. For this reason, by providing the resonator structure, it is possible to obtain pictures of high frontal brightness.

A seventh embodiment will now be described, making reference to FIGS. 22 to 26. This embodiment concerns a mechanism for judging degradation in light emitting units that employ organic EL elements.

It is known that a light emitting unit which employs an organic EL element will gradually deteriorate, as a natural phenomenon, as the total time that it has been driver accumulates, and that the brightness thereof will gradually decline. This decline is represented qualitatively in FIG. 22. When brightness is plotted against drive time, with both the vertical and horizontal axes graduated logarithmically, as in FIG. 22, the decline becomes roughly linear. Moreover, since the light emitting layer structure of the organic EL element is ordinarily driven with a constant current, the relationship between drive time and the voltage on the terminals of the light emitting layer structure can be represented qualitatively as in FIG. 23. In other words, as the drive time increases and degradation advances, the terminal voltage gradually increases. The exact way in which these property trends plotted in FIG. 22 and 23 change will differ according to the organic material used (i.e. the color of light emitted).

Figure 24:
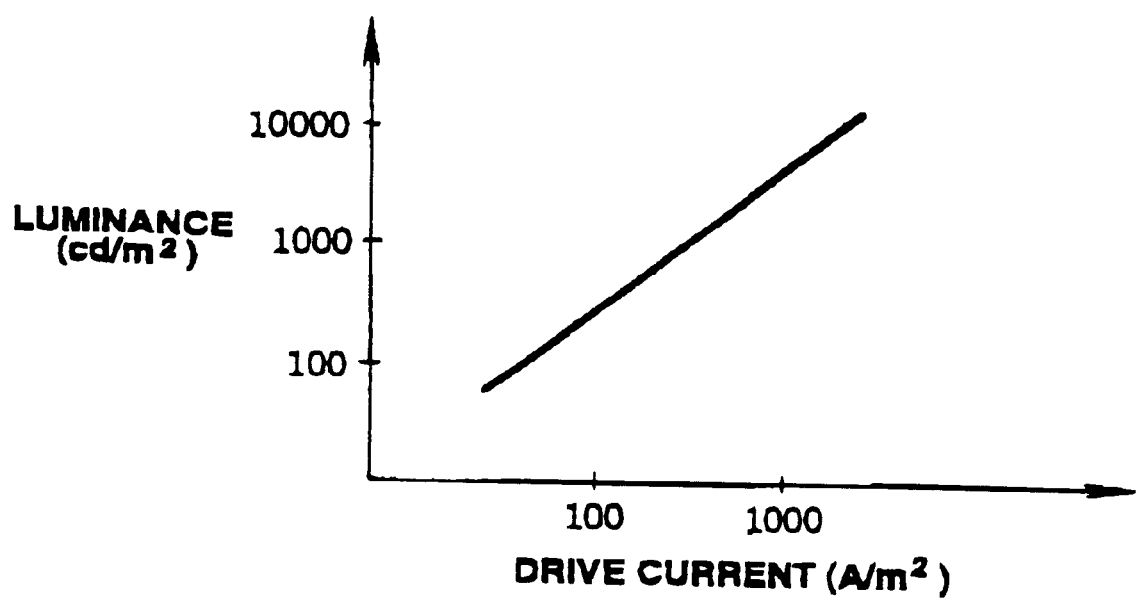
FIG. 24 is a graph that represents the relationship between brightness and current value in a light emitting unit having an organic EL element as its light emitting layer.

The qualitative relationship between light-emission brightness and the current applied to the organic EL element light emitting film structure is plotted in FIG. 24. When this plot is made on vertical and horizontal axes graduated logarithmically, as in FIG. 24, the light-emission brightness will be seen to increase roughly linearly relative to the current.

Figure 25:
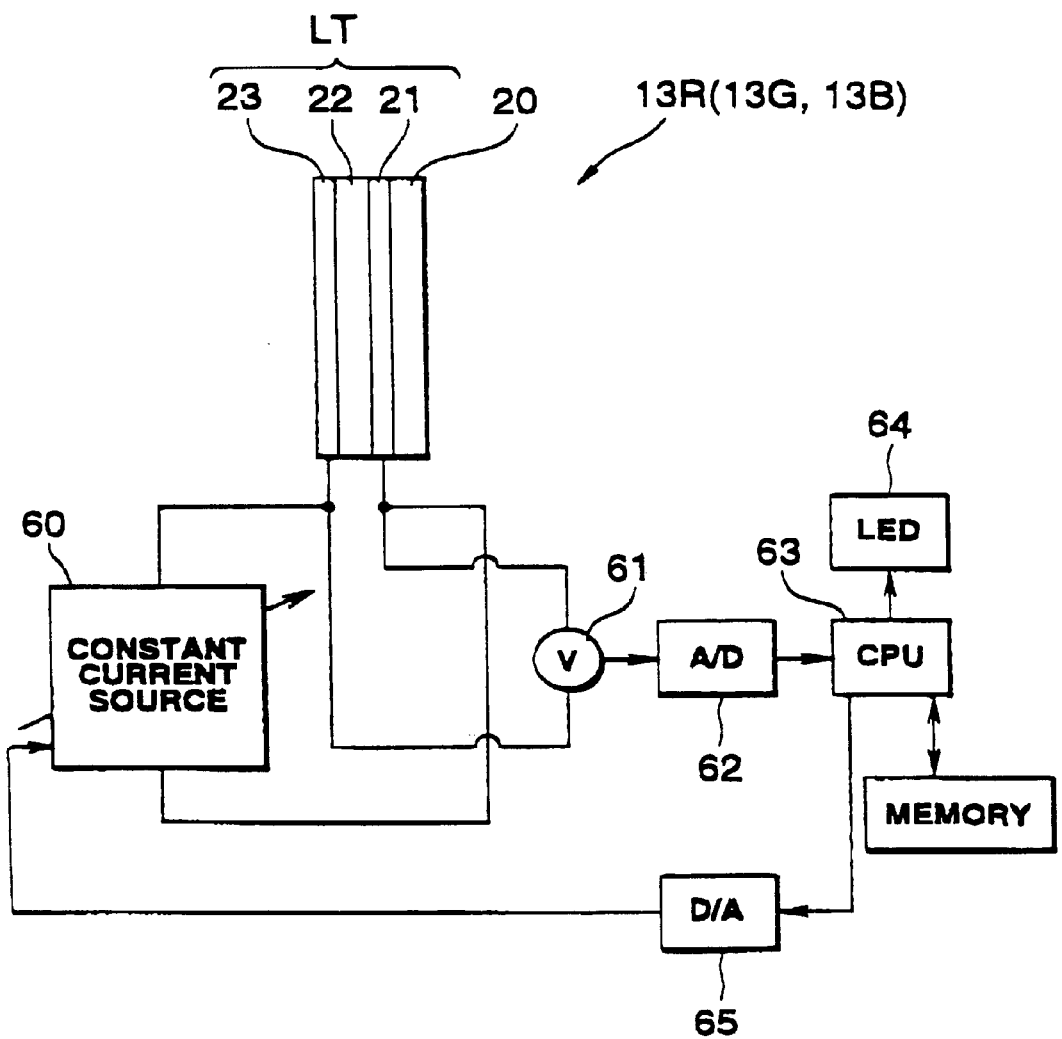
FIG. 25 is a block diagram of one example of terminal voltage measuring and control circuitry for a light emitting unit in a liquid crystal projector that concerns a seventh embodiment of the present invention.

In view of these circumstances, in the liquid crystal projector that is the projection display apparatus to which this embodiment pertains, the measurement and control circuitry diagrammed in FIG. 25 is connected to the light emitting unit 13R (13G, 13B). A constant-current supply 60 is connected between the electrodes of the light emitting film structure LT of the light emitting unit 13R (13G, 13B), providing a constant-current drive. This constant-current source 60 is made so that the constant-current value can be altered by control signals.

A voltmeter 61 is connected in order to measure the terminal voltage between these electrodes. Measurement signals from this voltmeter 61 are converted to digital values by an A/D converter 62, and input to a CPU 63. To the CPU 63 is connected both a LED 64 that notifies when it is time to replace a light emitting unit and a D/A converter 65. The CPU 63 performs the processing diagrammed in FIG. 26, turning the LED 64 on and off, while, at the same time, sending control signals via the D/A converter 65 to the constant-current source 60 so as to control the constant-current value.

Figure 26:
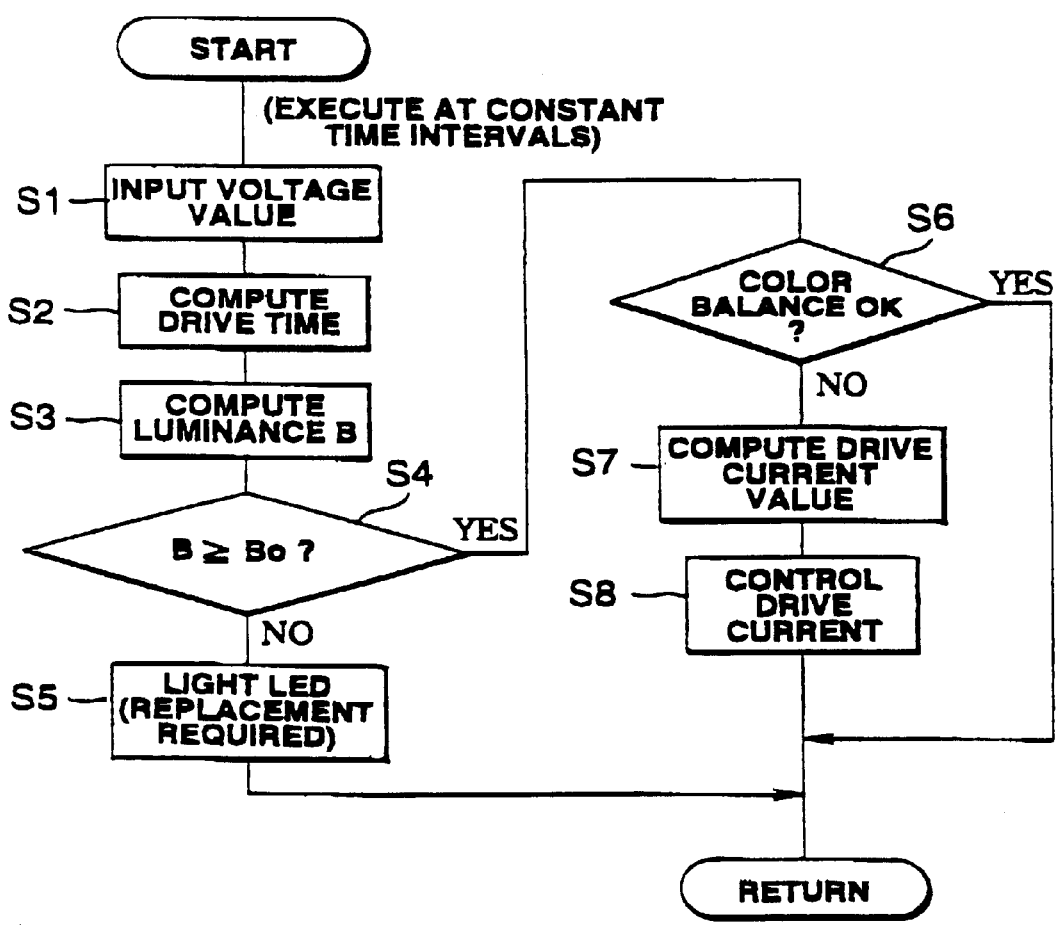
FIG. 26 is a flowchart of CPU processing in the seventh embodiment.

One example of a control operation of the CPU 63 is now described with reference to FIG. 26. This control operation is executed at set time intervals for each color, by, for example, an interrupt routine once every hour.

The CPU 63 first reads in the measured voltage value from the voltmeter 61 via the A/D converter 62 (step S1). Then, referencing a table for the curve shown in FIG. 23, it performs a reverse computation to find the cumulative value of the drive time that corresponds to the voltage value measured (step S2). Next, referencing a table for the curve shown in FIG. 22, it performs a reverse computation to find the brightness B corresponding to the cumulative value of the drive time (step S3).

Next the CPU 63 determines whether or not the brightness B so found is equal to or still exceeds a preset allowable brightness value B0 (step S4). If the answer is NO, that is, if B<B0, then the brightness has fallen below the allowable value and the color pictures have darkened, so the LED 64 will be immediately lighted, giving notice that it would be better to replace the light emitting unit (step S5).

Conversely, if the answer in step S4 is YES, then the CPU 63 judges whether or not the color balance between red, green, and blue is as set, based on brightness values for the three colors (step S6). When the color balance is not as set (NO), then the CPU 63 does a reverse computation to determine the value of the drive current needed to obtain the desired brightness, referencing a table for the curve plotted in FIG. 24 (step S8). Having done that, it sends control signals for obtaining that drive current value to the constant-current source 60 via the D/A converter 65. In this way, the value of the drive current is corrected, and the desired brightness value for the color handled by the light emitting unit 13R (13G, 13B) is obtained.

By monitoring the voltage on the terminals of the light emitting units in this manner, notification can be made, automatically and accurately, when it is time to replace the light emitting units, making maintenance easier, and providing a continually bright picture. In addition, the color balance is automatically corrected from the terminal voltage value, thus providing a continually stable and high-quality picture. In the processing diagrammed in FIG. 26 and described in the foregoing, the reverse computations pertaining to FIGS. 22 through 24 need not necessarily reference tables; instead, the configuration may be made so that values are found by calculating from the approximate curve (straight line). An even simpler technique may also be used, wherein, without exactly finding the brightness value, the cumulative drive time sum is found from the terminal voltage value, which cumulative sum is compared against limiting values of drive times determined through experience, enabling the useful life of the light emitting layer to be determined more expediently from the comparison results.

Moreover, it is also permissible to combine and implement, as expedient, some of the configurations and means of the several embodiments described in the foregoing, and thereby further enhance the various benefits described in the foregoing, such as achieving smaller sizes and lighter weights in the overall liquid crystal projector, obtaining pictures of high brightness, and simplifying maintenance and inspection operations.

An eighth embodiment will now be described, making reference to FIG. 27. This embodiment-concerns a light source and a method and apparatus for controlling the light source. FIG. 1 is a simplified cross-sectional view of the configuration of the light source.

A light emitting unit 100 is configured such that a transparent electrode film 102 that forms the anode, an organic light emitting layer 103, and a metallic electrode film 104 that forms the cathode are sequentially laminated onto a glass substrate 101, and this is sealed with a sealing substrate 105. The planar size of this light emitting unit 100 will depend on the object that is to be illuminated, but it may, for example, be made on the order of 30 mm×25 mm. The sealing substrate 105 of the light emitting unit 100 is provided with a heat sink 106 with an intervening layer of grease 109 exhibiting good thermal conductivity. To the heat sink 106 is attached, across another intervening layer of grease 109 exhibiting good thermal conductivity, a flat-panel-shaped electronic cooling element 107 which utilizes the Peltier effect. The sealing substrate 105 that configures the light emitting unit 100 may also do double duty as the heat sink 106. The electronic cooling element 107 is air-cooled by a fan 108.

A thermocouple is imbedded into the heat sink 106 to serve as a temperature sensor 110 to measure the temperature of the heat sink. Something other than a thermocouple, such as a thermistor, may be used as the temperature sensor 110. Also, the temperature sensor may be attached to the heat sink instead of being imbedded in it.

A temperature switch circuit can drive and control both a lighting switch 112 for lighting and extinguishing, and a cooling switch 114 for supplying or cutting off current to the electronic cooling element 107. The positive terminal of a DC power source 113 is connected to the transparent electrode, while the negative terminal thereof is connected via the lighting switch 112 to the metal electrode film 104. The positive electrode of a DC power supply 115 is connected directly to the electronic cooling element 107 while the negative terminal thereof is connected via the cooling switch 114 to the electronic cooling element 107.

When DC voltage from the DC power supply 113 is applied to the transparent electrode film 102 and the metal electrode film 104, the organic light emitting layer 103 emits light, and the emitted light 116 is radiated toward a glass substrate 101. The organic light emitting layer 103 may be a single layer or it may have a laminar structure made up of an electron-transport carrying layer consisting of an organic film, and an organic light emitting film.

A method of controlling the light source apparatus is next described.

First is described a procedure for lighting an organic EL planar light source for illuminating the body to be illuminated.

Before lighting the light emitting unit 100, the electronic cooling element 107 is first activated by closing the cooling switch 114. The electronic cooling element 107, thereupon, driven by the DC power supply 115, gradually cools the heat sink 106 and the light emitting unit 100.

The temperature of the heat sink 106 is monitored by the temperature sensor 110. At the point in time when the heat sink reaches a certain set temperature, say 10° C., for example, the lighting switch 112 for the organic EL planar light source is closed by the temperature switch circuit 111.

By closing the lighting switch 112, electric power is supplied to the light emitting unit 100 from the DC power source 113, and the light emitting unit 100 radiates light.

If the light emitting unit 100 is lighted before it has been adequately cooled, there will be a pronounced rise in the temperature of the organic EL element, and the organic EL element will begin to degrade in a short time, with its brightness declining.

If, on the other hand, the organic EL element is excessively cooled, dew will form on the front and side surfaces of the organic EL element. This dew will alter the radiation pattern of the emitted light, and cause changes in the properties of the organic film which are readily altered by moisture. When the organic EL element is lighted, even it the light emitting unit 100 is being cooled by the electronic cooling element 107, the temperature of the organic EL element will, due to the heat generated by the organic EL element, reach a steady state at a temperature that is higher than the temperature of the heat sink 106, so that no dew forms on the light source.

Next is described a procedure for extinguishing the organic EL planar light source in order to stop illuminating the body being illuminated.

First of all, the current being supplied to the organic light emitting layer 103 configuring the light emitting unit 100 is reduced, lowering the brightness of the light being emitted. Almost simultaneously with lowering the brightness of the emitted light, the cooling switch 114 is opened, stopping the supply of power to the electronic cooling element 107 and so terminating cooling.

At this time, the current flowing through the organic light emitting layer 103 need only be enough to make the organic light emitting layer shine slightly; the light emitting unit 100 need only generate enough heat to keep dew from forming on its surface.

If, at this juncture, a large current is passed through the organic light emitting layer 103, the temperature of the light emitting unit 100 will rise because the cooling has been terminated, so that, as a result, functional degradation of the light source will be accelerated.

At the point in time where the temperature of the heat sink 106 has risen to a certain set temperature, say 10° C., for example, the lighting switch 112 is opened, terminating the supply of current to the organic light emitting layer 103, and extinguishing the organic EL element.

When, instead of implementing the procedure just described, the light emitting unit 100 is extinguished simultaneously with terminating the electronic cooling element 107, the heat sink 106 will still be cold, and the generation of heat by the light emitting element 100 has been terminated, so the organic EL element will be chilled and dew will form on it.

Instead of the grease 109 that is interposed between the heat sink 106 and the sealing substrate 105 of the light emitting unit 100 in the light source configuration in this embodiment, it is possible to interpose a sheet exhibiting high thermal conductivity. When this is done, it becomes easy to remove the organic EL planar light source 100 from the heat sink 106, thus making it easy to replace the organic EL planar light source 100.

Figure 28:
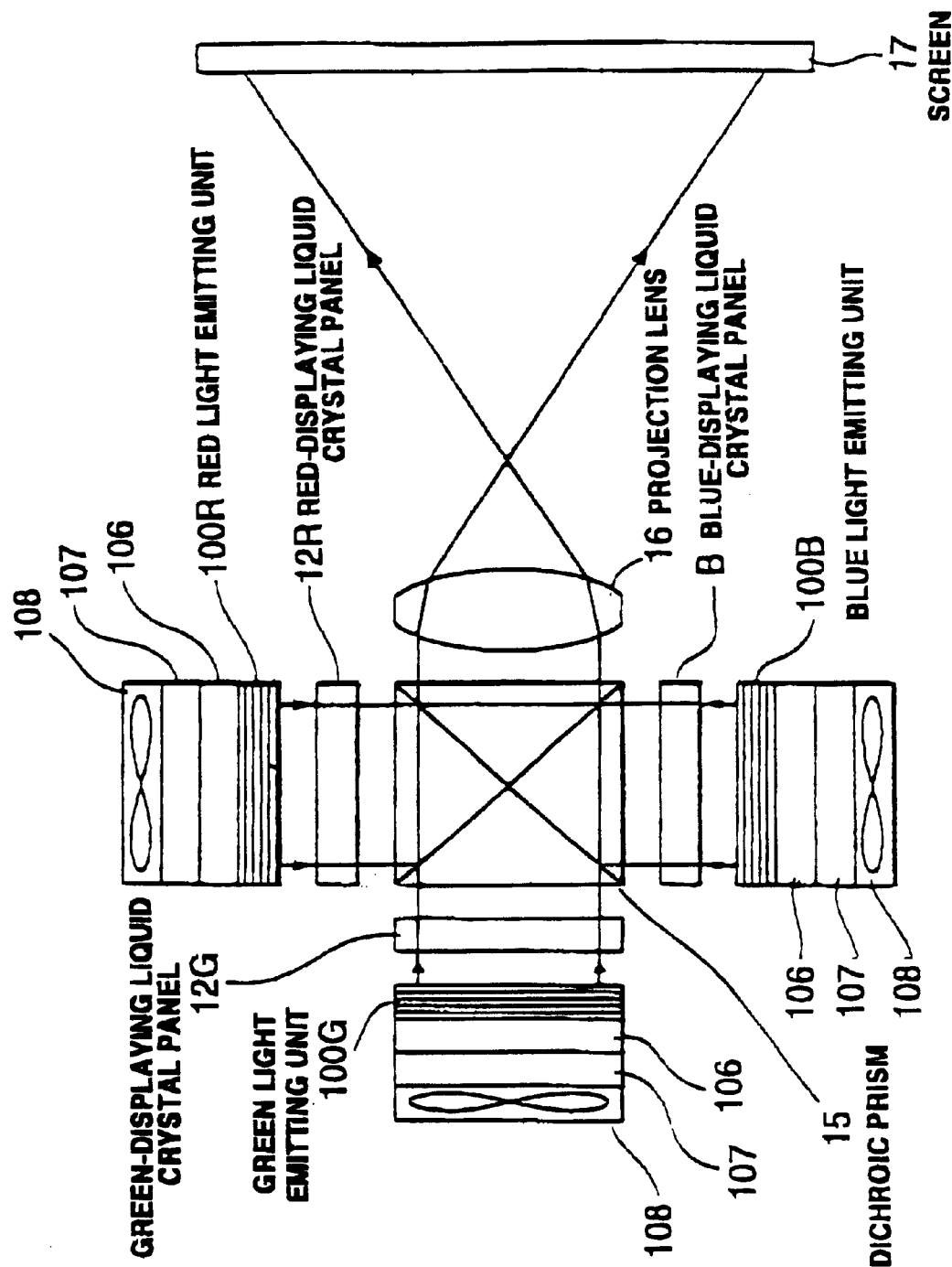
FIG. 28 is a simplified cross-sectional view of the main optical system that configures a liquid crystal display apparatus in a ninth embodiment of the present invention.

A ninth embodiment will now be described, making reference to FIG. 28. This embodiment concerns the application of the eighth embodiment to a projection display apparatus. FIG. 28 is a simplified cross-sectional view of the main optical systems that configure a projection display apparatus.

With respect to this projection display apparatus, configurational elements that are the same as or similar to those explained in connection with the first embodiment are indicated by the same reference characters, while, with respect to the apparatus for implementing the control method for the light source apparatus, those configurational elements that are the same as or similar to those explained in connection with the eighth embodiment are indicated by the same reference characters, and the description thereof is either omitted or abridged. The same applies to descriptions for the tenth and subsequent embodiments herein.

The images displayed on the red-displaying liquid crystal panel 12R that displays red component images, on the green-displaying liquid crystal panel 12G that displays green component images, and on the blue-displaying liquid crystal panel 12B that displays blue component images are combined by the dichroic prism 15, then enlarged by the projection lens 16 and displayed on the screen 17.

In the interest of clarity, the structures of the liquid crystal panels and projection lens are not drawn, but those components are depicted as blocks.

Either a reflective or a transmissive screen can be employed for the screen 17.

The red-displaying liquid crystal panel 12R is illuminated by a red-light emitting unit 100R that emits red light and that is positioned at its back. The light emitting unit 100R has the structure diagrammed in FIG. 27, for example, and is cooled by a cooling mechanism that comprises a heat sink 106, electronic cooling element 107, and fan 108, as shown in the same FIG. 27. In FIG. 28, in the interest of clarity, the grease, temperature sensor, and temperature switch circuit depicted in FIG. 28 are omitted, but the control method described in connection with the eighth embodiment is used to start and stop the electronic cooling element 107, and to control the lighting and extinguishing of the organic EL planar light source.

Similarly, for the green-displaying liquid crystal panel 12G and the blue-displaying liquid crystal panel 12S, a green-light emitting unit 100G that emits green light is positioned at the back of the green-displaying liquid crystal panel 12G, and a blue-light emitting unit 100B that emits blue light is positioned at the back of the blue-displaying liquid crystal panel 12B, and the respective organic EL planar light sources therefor are cooled by a cooling mechanism like the one described in connection with the eighth embodiment.

Figure 29:
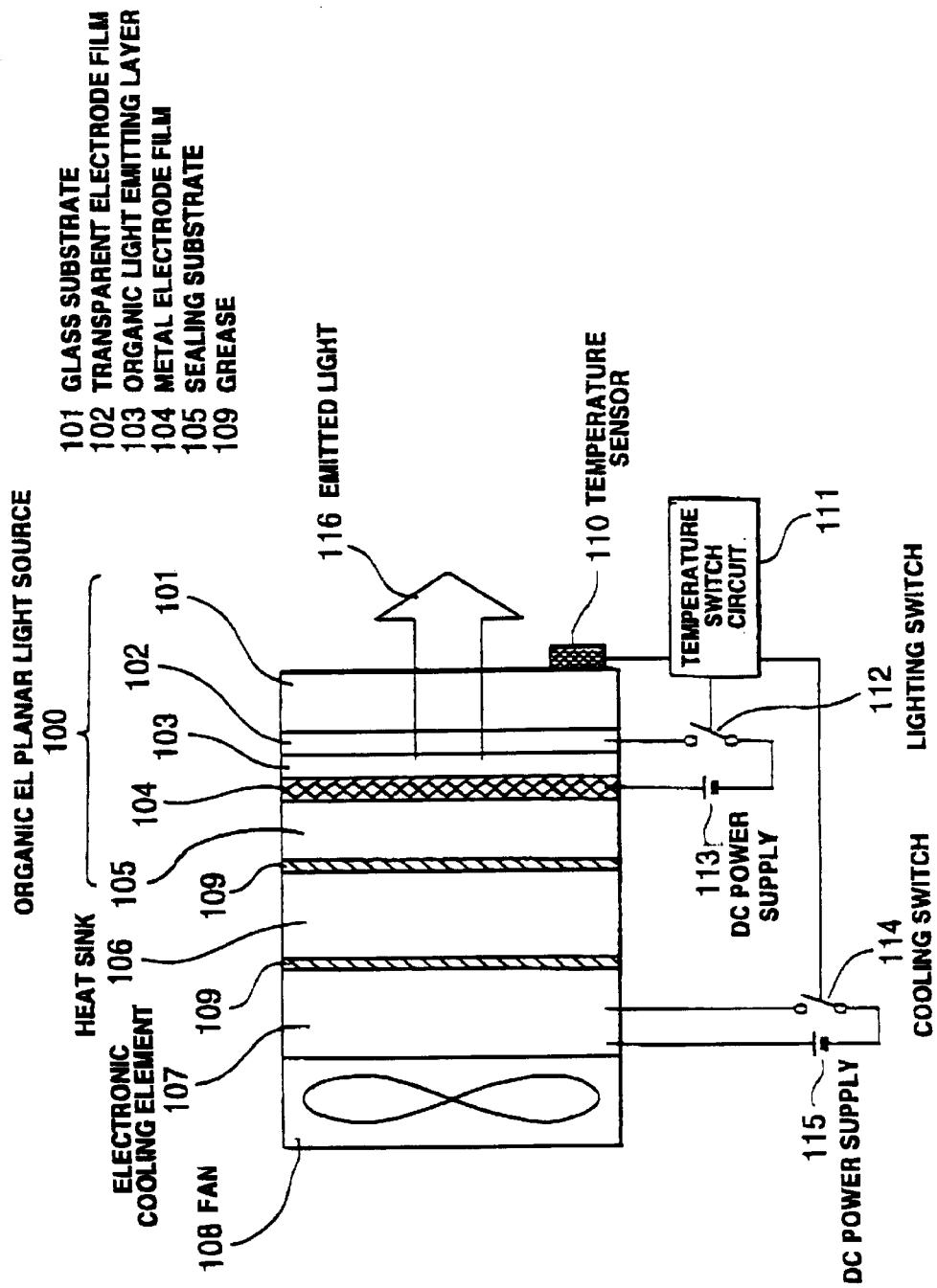
FIG. 29 is a simplified cross-sectional view of a light source in a tenth embodiment of the present invention.

A tenth embodiment will now be described, making reference to FIG. 29. This embodiment concerns a light source and a method and apparatus for controlling the light source. FIG. 29 is a simplified cross-sectional view of the configuration of the light source.

Figure 27:
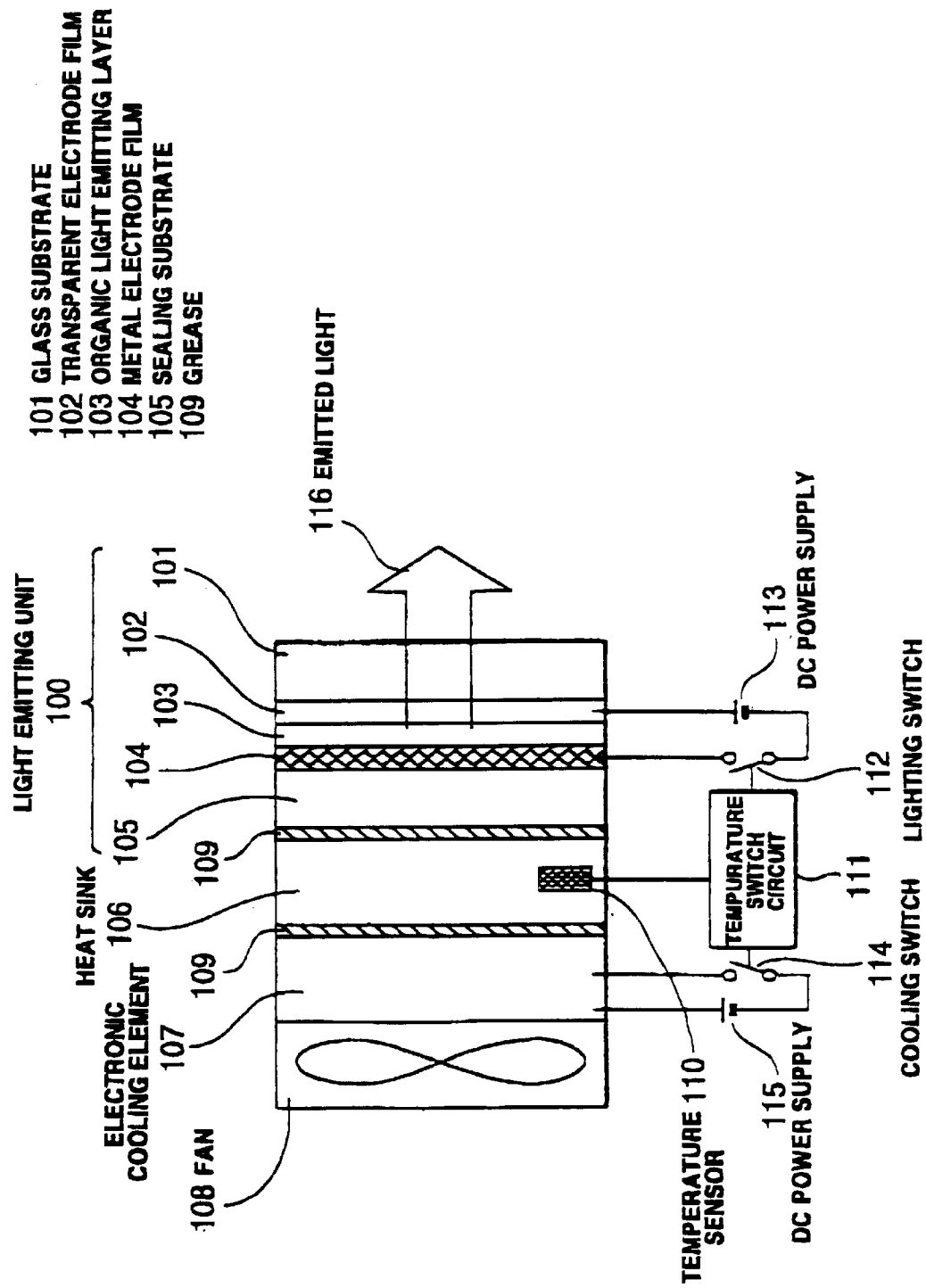
FIG. 27 is a simplified cross-sectional view of the configuration of a light source in an eighth embodiment of the present invention.

Except insofar as the position of the temperature sensor 110 is different than it is in the configuration of the light source in the eighth embodiment diagrammed in FIG. 27, all of the configurational elements are the same.

The temperature of the light emitting unit 100 is detected by the temperature sensor 110, and a temperature switch circuit 111 is provided which, in response to that temperature, controls either the lighting switch 112 for the light emitting unit 100 or the cooling switch 114 for the electronic cooling element 107.

The light source control method is described next.

First, the procedure used when lighting the organic EL element in order to illuminate the body to be illuminated is described.

Before lighting the light emitting unit 100, the electronic cooling element 107 is first activated. The electronic cooling element 107 is driven by the DC power supply 115, whereupon it gradually cools the heat sink 106 and the light emitting unit 100.

The temperature of the light emitting unit 100 is monitored by the temperature sensor 110. When the temperature of the light emitting unit 100 reaches a certain set temperature, say 10° C., for example, the lighting switch 112 is closed by the temperature switch circuit 111.

By closing the lighting switch 112, power is supplied from the DC power supply 113 to the light emitting unit 100 and the light emitting unit 100 radiates light.

Next is described a procedure for extinguishing the organic EL element in order to stop illuminating the object being illuminated.

First of all, the current being supplied to the organic light emitting layer 103 configuring the light emitting unit 100 is reduced, lowering the brightness of the light being emitted. Almost simultaneously with lowering the brightness of the emitted light, the cooling switch 114 is opened, stopping the supply of power to the electronic cooling element 107 and so terminating cooling. At this time, the current flowing through the organic light emitting layer 103 need only be enough to make the organic light emitting layer shine slightly; the organic EL element need only generate enough heat to keep dew from forming on the surface of the light emitting unit 100.

After cooling has been terminated, the heat sink 106 will still be cooling the light emitting unit 100 for a little while, but when the temperature of the heat sink 106 begins to rise, the temperature of the light emitting unit 100 will also begin to rise.

At the point in time when the temperature of the light emitting unit 100 has risen to a certain set temperature, say 10° C., for example, the lighting switch 112 will be opened, the supply of current to the organic light emitting layer 103 will be stopped, and the organic EL element will be extinguished.

In the eighth and tenth embodiments, the temperature sensor was attached either to the heat sink or to the organic EL element, that is, to only one of the two. It is also possible, however, to attach it to both, and thus, while monitoring the temperatures of both the heat sink and the organic EL element, to control the timing of the initiation and termination of cooling, and of lighting and extinguishing the organic EL element.

An 11th embodiment will now be described. This embodiment concerns the application of a control apparatus for a light source apparatus in a projection type liquid crystal display apparatus.

In other words, the 11th embodiment is the application of the tenth embodiment to a projection display apparatus.

Figure 30:
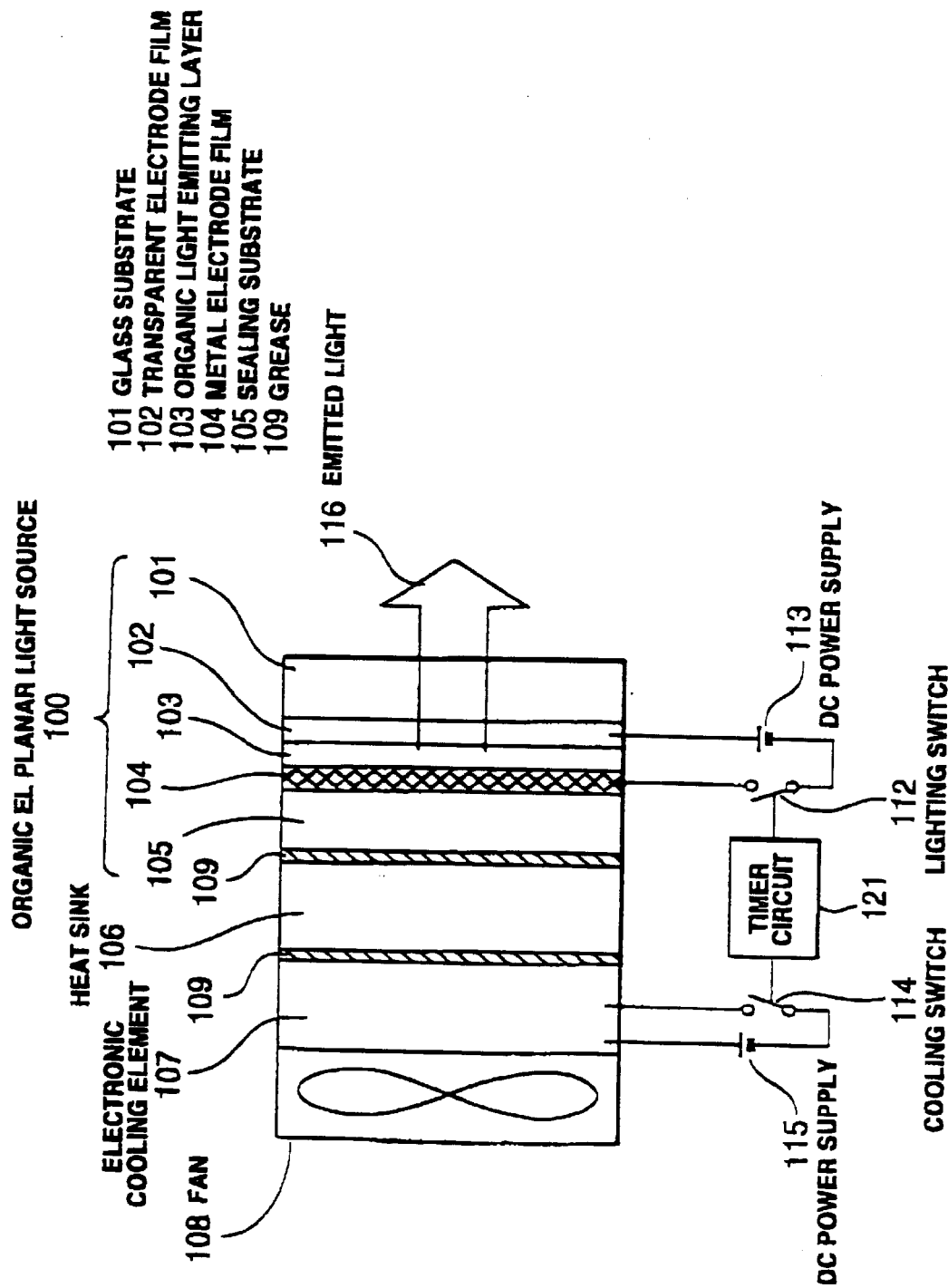
FIG. 30 is a simplified cross-sectional view of a light source in an eleventh embodiment of the present invention.
Figure 31:
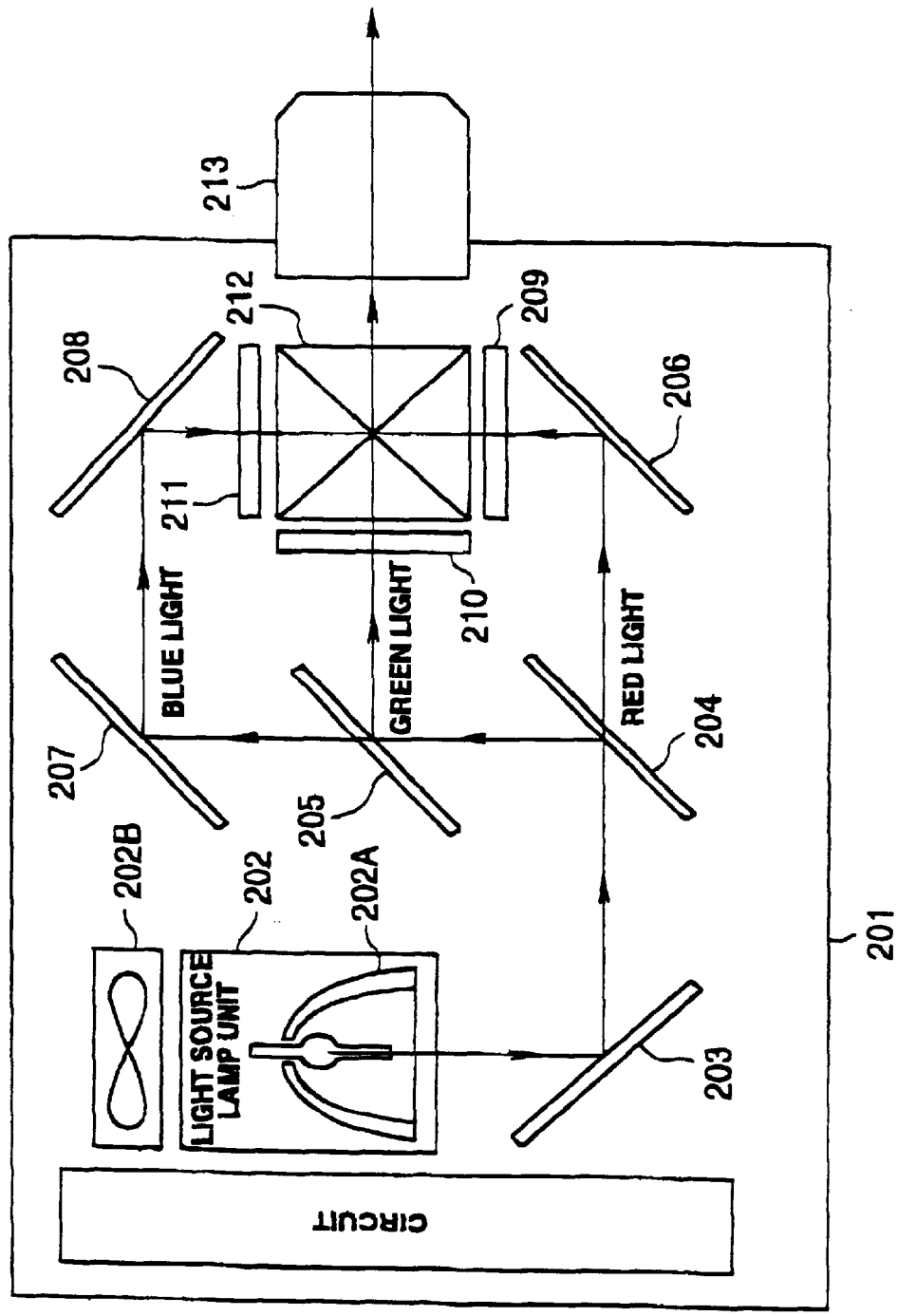
FIG. 31 is a simplified plan of the configuration of a conventional example of a liquid crystal projector.
Figure 32:
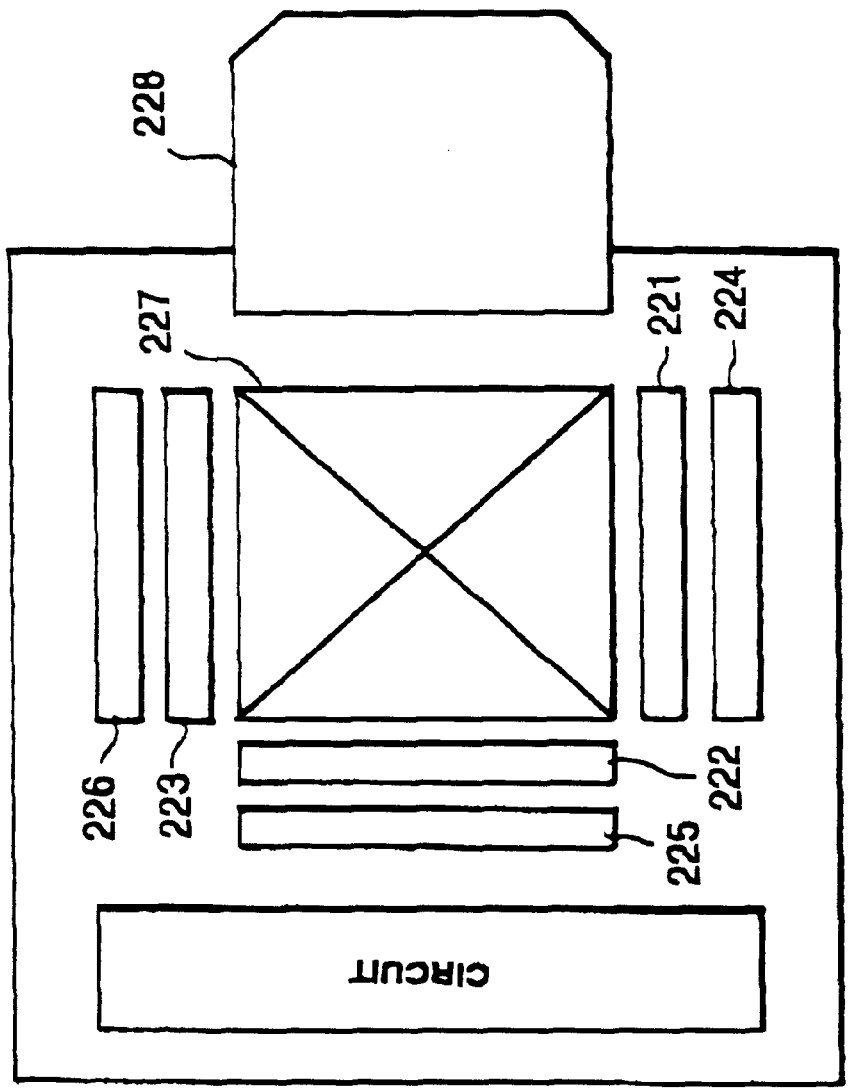
FIG. 32 is a simplified plan of the configuration of another conventional example of a liquid crystal projector.
Figure 33:
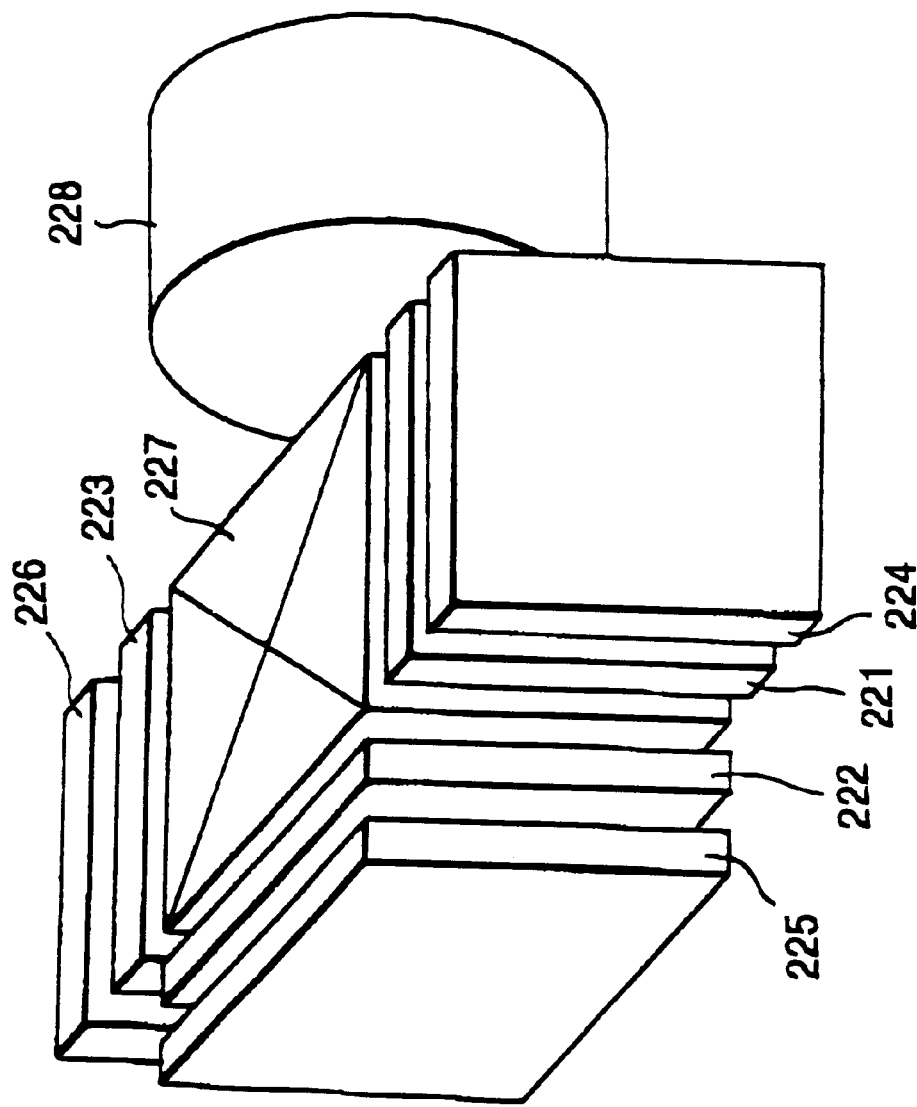
FIG. 33 it a simplified diagonal view of the configuration in FIG. 32.

A 12th embodiment will now be described, making reference to FIG. 30. This embodiment concerns a light source and a method and apparatus for controlling the light source. FIG. 30 is a simplified cross-sectional diagram of the configuration of a light source.

In this configuration, the temperature sensor 110 and the temperature switch circuit 111 in the light source of the eighth embodiment diagrammed in FIG. 27 are removed, and in their place a timer circuit 121 is provided. The other configurational elements, that is, the light emitting unit 100, heat sink 106, electronic cooling element 107, and fan 108 are the same as in the eighth embodiment.

The timer circuit 121 controls the lighting switch 112 of the light emitting unit 100 or the cooling switch 114 of the electronic cooling element 107.

A light source control method is now described.

A procedure is first described for lighting the organic EL planar light source in order to illuminate the object to be illuminated.

Before lighting the light emitting unit 100, the electronic cooling element 107 is first activated by closing the cooling switch 114. The electronic cooling element 107 is driven by the DC power supply 115, and the heat sink 106 and organic EL planar light source 100 are gradually cooled.

The timer circuit 121 begins measuring elapsed time from the moment the cooling switch 114 is closed. At the point in time when some set time has elapsed since the closing of the cooling switch 114, the lighting switch 112 that is connected to the light emitting unit 100 is closed.

By closing the lighting switch 112, power is supplied to the light emitting unit 100 from the DC power supply 113, and the light emitting unit 100 radiates light.

By measuring beforehand the variation in the temperature of the light emitting unit 100 from the start of cooling, the time that it takes for the temperature of the light emitting unit 100 to reach a certain set temperature after the cooling switch 114 is closed can be found. Based on that time, it is possible to set the time from the closing of the cooling switch 114 to the closing of the lighting switch 112.

Next, a procedure for extinguishing the light emitting unit 100 in order to stop illuminating the object being illuminated will be described.

First of all, the current being supplied to the organic light emitting layer 103 configuring the light emitting unit 100 is reduced, lowering the brightness of the light being emitted.

Almost simultaneously with lowering the brightness of the emitted light, the cooling switch 114 is opened, stopping the supply of power to the electronic cooling element 107 and so terminating cooling.

At the point in time where some set time interval has elapsed since the opening of the cooling switch 114, the lighting switch 112 connected to the light emitting unit 100 is opened, and the light emitting unit is extinguished.

By measuring beforehand the change in the temperature of the organic EL element after the termination of cooling, it is possible to determine the time that it takes for the organic EL element to reach some set temperature after the opening of the cooling switch 114 and the termination of cooling. Based on this time period, it is possible to set the time from the opening of the cooling switch 114 to the opening of the lighting switch 112.

In the configuration of the light source in this embodiment, instead of the grease 109 interposed between the heat sink 106 and the sealing substrate 105 of the light emitting unit 100, it is possible to interpose a sheet exhibiting high thermal conductivity. When that is done, it becomes easy to remove the heat sink 106 from the light emitting unit 100, making it easy to replace the light emitting unit 100.

A 13th embodiment will now be described. This embodiment concerns the application of the 12th embodiment to a projection display apparatus.

In the 13th embodiment, in other words, an example is described wherein the 12th embodiment is applied to the projection display apparatus diagrammed in FIG. 28.

In the foregoing, descriptions have been given for the light source apparatuses and for the methods and apparatuses for controlling the light source apparatuses of the present invention, together with descriptions of display apparatuses in which those control methods and apparatuses are applied.

It is possible to conceive of many different configurations and control methods for shifting the timing of the lighting of the light source apparatus and the timing of cooling in order to sufficiently cool the organic EL elements while suppressing the formation of dew on the organic EL elements, which is a main object of the present invention. For example, one can conceive of a configuration and control method wherein both a timer circuit and a temperature switch circuit are provided, wherein the temperature switch circuit is employed when lighting an organic EL element and the timer circuit is employed when extinguishing it.

It is also possible to provide a humidity sensor, and to vary either the set temperature or the set time according to the humidity.

The industrial potential of the present invention will now be discussed.

By implementing the projection display apparatus of the present invention, as described in the foregoing, it is possible to employ organic EL elements as light emitting layers, to provide cooling means therefor, attachment means permitting free attachment and detachment, means for regulating the directionality of the emitted light, means for raising the efficiency of the emitted light, and means for automatically determining the useful life, and to employ a resonator structure, wherefore a projection display apparatus can be provided in which light emitting units based on organic EL elements are employed, which is light in weight, small in size, and capable of practical implementation, and which overcomes problems that are very difficult to overcome with the prior art.

In particular, by installing cooling means comprising electronic cooling elements or heat-radiating fins in the light emitting units, it is possible to suppress degradation in light-emission performance caused by heat generated by the organic EL elements, thereby extending useful life, stabilizing brightness, and continually securing maximum brightness.

Also, by providing attachment means for attaching the light emitting units to the base on which the liquid crystal panels and light emitting units are mounted, so that they may be freely attached or detached, it is possible to make the light emitting units comprising organic EL elements to be individually independent, and to easily replace them in conditions wherein their electrical connections and optical positions are definitely secured. Thus the replacement operation is made more efficient and maintenance and inspection are simplified.

Furthermore, by measuring the terminal voltage across the electrodes of the light emitting film structure, determining the life expectancy of the light emitting film structure from that terminal voltage value, and, when the useful life is judged to have expired, announcing that fact, it is easy to determine when it is time to replace the light emitting units, and thereby to insure high quality picture displays and facilitate maintenance and inspection.

Moreover, by providing directionality-regulating means such as lens arrays or prism arrays to regulate the directionality of the light emitted from the light emitting units so that it faces the liquid crystal panels, the directionality of the light incident on the liquid crystal panels from the light emitting units comprising organic EL elements can be improved, the efficiency of light incidence on the liquid crystal panels can be enhanced, and pictures exhibiting high stabilized brightness can be presented.

Furthermore, by integrally forming microlens arrays or microprism arrays on the light-emission surfaces of the transparent substrates of the light emitting units, it is possible to raise the light-emission efficiency from the light emitting units comprising organic EL elements, and thus to present pictures exhibiting high stabilized brightness.

Moreover, by providing, in the light emitting layer structures of the light emitting units, resonator structures that selectively resonate and emit light of specific wavelengths, the directionality and efficiency of light incident on the liquid crystal panels can be sharply improved.

The light source apparatuses according to the present invention comprise organic EL elements and cooling mechanisms for cooling them, and either temperature sensors attached to the organic EL elements or to cooling means, or, alternatively, timers, so that the organic EL elements can be controlled in a cooled state using the cooling means.

The method of controlling the light source apparatus of the present invention, furthermore, is characterized by the fact that the timing both of cooling starting and stopping and of lighting and extinguishing the organic EL planar light sources is shifted, either by monitoring the temperature of the organic EL elements with temperature sensors, or by means of timers. Thus it is possible to sufficiently cool the organic EL elements while suppressing the formation of dew thereupon, so that degradation in the organic EL elements can be suppressed and their useful life extended.

The control apparatus for the light source apparatus of the present invention, moreover, is characterized by the fact that it controls the timing both of cooling starting and stopping and of lighting and extinguishing the organic EL planar light sources, either by monitoring the temperature of the organic EL elements with temperature sensors, or by means of timers.

Thus it is possible to sufficiently cool the organic EL elements while suppressing the formation of dew thereupon, so that degradation in the organic EL elements can be suppressed and their useful life extended.

Furthermore, if the method and the apparatus for controlling the light source apparatus of the present invention is implemented, the display apparatus of the present invention can be made significantly smaller than a display apparatus which uses an electric discharge lamp as the light source.

What is claimed is:

1. A projection display apparatus comprising:
   a base;
   at least one transmissive liquid crystal panel that is mounted on the base and displays an image;
      at least one light source unit replaceably mounted on the base and adjacent to one surface side of said liquid crystal panels, said at least one light source unit comprising:
- a light emitting unit provided with at least one organic EL element which includes:
  - a reflecting electrode layer;
  - a counter electrode layer facing said reflecting electrode layer; and
  - a light emitting layer provided between said reflecting electrode layer and said counter electrode layer; and
- a cooling body for radiating heat generated by said light emitting unit, said cooling body comprising:
  - a heat-dispersing unit for guiding and dispersing the heat; and
  - a heat-conductive body provided between said reflecting electrode layer and said heat-dispersing unit; and
- a projection lens positioned opposite to said liquid crystal panel for enlarging the image displayed on said liquid crystal panel and projecting said image onto a screen.

2. The projection display apparatus according to claim 1 wherein:
said heat-dispersing unit has a plurality of fins, a height of said plurality of fins in a center of the heat-dispersing unit being greater than in a periphery thereof.

3. The projection display apparatus according to claim 2, further comprising:
attachment means for freely attaching and detaching said light source unit to at least portions of a base.

4. The projection display apparatus according to claim 2, wherein said light emitting structure for said light emitting unit comprises a resonator structure that selectively resonates and emits light of a particular wavelength.

5. The projection display apparatus according to claim 1, wherein said organic EL element generates white light.

6. The projection display apparatus according to claim 1, comprising three of said at least one liquid crystal panel separately displaying the images in red components, green components, and blue components, three of said at least one organic EL element separately generate red, green, and blue light, exhibiting a structure wherein a dichroic prism is interposed in the optical path between said three liquid crystal panels and said projection lens.

7. The projection display apparatus according to claim 1, further comprising:
attachment means for freely attaching to and detaching from said base said at least one light source.

8. The projection display apparatus according to claim 7, wherein said at least one light source unit comprises:
- a board that mounts both said light emitting unit and said cooling body and having a plurality of terminals electrically connected to said reflective electrode layer and said counter electrode layer, and
- wherein said attachment means comprises:
  - a connector that is mounted on the base and that plugs said plurality of terminals; and
  - a guide that is mounted on the base and guides said board to said connectors.

9. The projection display apparatus according to claim 1, said light emitting unit further comprises a resonator structure that selectively resonates and emits light of a predetermined wavelength.

10. A projection display apparatus comprising:
at least one transmissive liquid crystal panel, which displays an image;
at least one light emitting unit being positioned on one surface of said liquid crystal panel, said light emitting unit comprising;
a transparent substrate; and
an organic EL element having a light emitting layer provided on said transparent substrate;
means for raising light-emission efficiency, said means being formed integrally on said transparent substrate of said light emitting unit, comprising a microlens array formed two-dimensionally on said transparent substrate, said microlens array having a pitch of a predetermined ratio with respect to a pixel pitch in the liquid crystal panel such that moire does not occur.

11. A projection display apparatus comprising:
a liquid crystal panel;
at least one light emitting unit located opposite to one surface of the liquid crystal panel and having a light emitting film structure including an organic EL element and being positioned between two electrodes;
a voltage measuring means for measuring a voltage between the electrodes of said light emitting film structure;
a useful-life assessment means for assessing useful life remaining in said light emitting film structure; and
an announcement means for announcing said useful life when said useful-life assessment means has assessed said useful life.

12. The projection display apparatus according to claim 11, wherein said useful-life assessment means is means for assessing said useful life by converting a value of said voltage to a brightness value and comparing said brightness value against a reference value.

13. A projection display apparatus comprising:
a liquid crystal panel;
at least one light emitting unit located opposite to one surface of the liquid crystal panel and having a light emitting film structure being made of at least one organic EL element including a light emitting layer, and being positioned between two electrodes;
voltage measuring means for measuring a voltage between the electrodes of said light emitting film structure;
color-balance assessment means for assessing a red, green, and blue color balance on basis of a value of said voltage measured by said voltage measuring means;
and color-balance correction means for automatically correcting said color balance on basis assessed by said color-balance assessment means.

14. A light source apparatus comprising:
at least one light source unit comprising:
at least one light emitting unit provided with at least one organic EL element as a light emitting layer; and
a cooling means provided in said at least one light emitting unit for radiating heat generated by said at least one light emitting unit; and
at least one of elapsed time measuring means for measuring elapsed time after start of said cooling means and elapsed time measuring means for measuring an elapsed time period after stopping of said cooling means, the elapsed time period being used to control drive of the organic EL element.

15. A projection display apparatus which illuminates a liquid crystal display element by the light source apparatus according to claim 14, wherein said projection display apparatus enlarges and projects an image displayed on said liquid crystal display element illuminated with light radiated from said organic EL element by a projection lens.

16. A light source apparatus comprising:
at least one light source unit comprising at least one light emitting unit provided with at least one organic EL element as a light emitting layer; and
a cooling means provided in said at least one light emitting unit for radiating heat generated by said at least one light emitting unit; and
temperature detection means for measuring temperature of said cooling means;
said organic EL element being lighted at a point in time when temperature detected by said temperature detection means reaches a set temperature, after said cooling means has started to work.

17. A projection display apparatus which illuminates a liquid crystal display element by a light source apparatus according to claim 16, wherein said projection display apparatus enlarges and projects an image displayed on said liquid crystal display element illuminated with light radiated from said organic EL element by a projection lens.

18. A light source apparatus comprising:
at least one light source unit comprising a light emitting unit provided with at least one organic EL element as a light emitting layer, and a cooling means, provided in said light emitting unit for radiating heat generated by said light emitting unit; and
a temperature detection means for measuring a temperature of said organic EL element,
said organic EL element being lighted at a point in time when the temperature detected by said temperature detection means reaches a set temperature, after said cooling means has started to work.

19. A projection display apparatus which illuminates a liquid crystal display element by a light source apparatus controlled by the light source apparatus control method according to claim 18, wherein said projection display apparatus enlarges and projects an image displayed on said liquid crystal display element illuminated with light radiated from said organic EL element by a projection lens.

20. A light source apparatus comprising:
at least one light source unit comprising at least one light emitting unit provided with at least one organic EL element as a light emitting layer; and
a cooling means provided in said at least one light emitting unit for radiating heat generated by said at least one light emitting unit; and
a temperature detection means for measuring temperature of said cooling means, after reducing drive current going to said organic EL element, said cooling means being stopped, and
said organic EL element being extinguished at a point in time when the temperature detected by said temperature detection means reaches a set temperature.

21. A projection display apparatus which illuminates a liquid crystal display element by a light source apparatus controlled by the light source apparatus control method according to claim 20, wherein said projection display apparatus enlarges and projects an image displayed on said liquid crystal display element illuminated with light radiated from said organic EL element by a projection lens.

22. A light source apparatus comprising:
at least one light source unit comprising:
at least one light emitting unit provided with at least one organic EL element as a light emitting layer, and
a cooling means provided in said light emitting unit for radiating heat generated by said light emitting unit; and
a temperature detection means for measuring a temperature of said organic EL element, after reducing drive current going to said organic EL elements, said cooling means being stopped, and
said organic EL elements being extinguished at a point in time when the temperature detected by said temperature detection means reaches a set temperature.

23. A projection display apparatus which illuminates a liquid crystal display element by a light source apparatus controlled by the light source apparatus control method according to claim 22, wherein said projection display apparatus enlarges and projects an image displayed on said liquid crystal display element illuminated with light radiated from said organic EL element by a projection lens.

24. A light source apparatus comprising:
at least one light source unit comprising:
at least one light emitting unit provided with at least one organic EL element as a light emitting layer; and
a cooling means provided in said at least one light emitting unit for radiating heat generated by said at least one light emitting unit; and
elapsed time measuring means for measuring elapsed time from start of said cooling means, said organic EL element being lighted after a predetermined period of time has elapsed since said cooling means started to work.

25. A projection display apparatus which illuminates a liquid crystal display element by a light source apparatus controlled by the light source apparatus control method according to claim 24, wherein said projection display apparatus enlarges and projects an image displayed on said liquid crystal display element illuminated with light radiated from said organic EL element by a projection lens.

26. A light source apparatus comprising:
at least one light source unit comprising at least one light emitting unit provided with at least one organic EL element as a light emitting layer; and
a cooling means provided in said at least one light emitting unit for radiating heat generated by said at least one light emitting unit;
elapsed time measuring means for measuring elapsed time from stoppage of said cooling means, after reducing drive current going to said organic EL element, said cooling means stopping working, and
said organic EL element being extinguished thereafter.

27. A projection display apparatus which illuminates a liquid crystal display element by a light source apparatus controlled by the light source apparatus control method according to claim 26, wherein said projection display apparatus enlarges and projects an image displayed on said liquid crystal display element illuminated with light radiated from said organic EL element by a projection lens.

28. A control method for a light source apparatus comprising at least one light source unit comprising:
at least one light emitting unit provided with at least one organic EL element as a light emitting layer; and
a cooling means provided in said at least one light emitting unit for radiating heat generated by said at least one light emitting unit, the method comprising:
starting to drive said cooling means;
detecting temperature of said cooling means;
lighting said at least one organic EL element;
illuminating a liquid crystal display element with light radiated from said at least one organic EL element;
controlling said light source apparatus such that, when driving said organic EL element, said at least one organic EL element is lighted at a point in time when, after said cooling means has been started, the detected temperature reaches a set value for lighting, and such that, when extinguishing said organic EL element, said cooling means is stopped after reducing drive current going to said organic EL element; and extinguishing said organic EL element at another point in time when the detected temperature reaches a set value for extinguishing.

29. The control method for a light source apparatus according to claim 28, applied to a projection type projection display apparatus, further comprising:

displaying an image on said liquid crystal display element; and enlarging and projecting the image by a projection lens.

30. A projection display apparatus which illuminates a liquid crystal display element by a light source apparatus controlled by the control method according to claim 28, wherein said projection display apparatus enlarges and projects an image displayed on said liquid crystal display element by a projection lens.

31. A control method for a light source apparatus comprising at least one light source unit comprising:

at least one light emitting unit provided with at least one organic EL element as a light emitting layer; and a cooling means provided in said at least one light emitting unit for radiating heat generated by said at least one light emitting unit, the method comprising:
starting to drive said cooling means;
detecting temperature of said organic EL element;
lighting said organic EL element;
illuminating a liquid crystal display element with light radiated from said organic EL element;
controlling said light source apparatus such that, when lighting said organic EL element, said organic EL element is lighted at a point in time when, after said cooling means has been started, the detected temperature reaches a set value for lighting, and such that, when extinguishing said organic EL element, said cooling means is stopped after reducing drive current going to said organic EL element; and
extinguishing said organic EL element at another point in time when the detected temperature reaches a set value for extinguishing.

32. The control method for a light source apparatus according to claim 31, applied to a projection type projection display apparatus, further comprising:

displaying an image on said liquid crystal display element; and enlarging and projecting the image by a projection lens.

33. A projection display apparatus which illuminates a liquid crystal display element by a light source apparatus controlled by the control method according to claim 31, wherein said projection display apparatus enlarges and projects an image displayed on said liquid crystal display element by a projection lens.

34. A control method for a light source apparatus comprising at least one light source units comprising:

a least one light emitting unit provided with at least one organic EL element as a light emitting layer; and a cooling means provided in said at least one light emitting unit for radiating heat generated by said at least one light emitting unit, the method comprising:
starting to drive said cooling means;
measuring elapsed time from start of said cooling means;
stopping said cooling means;
measuring elapsed time from stoppage of said cooling means;
lighting said organic EL element;
illuminating a liquid crystal display element with light radiated from said organic EL element;
controlling said light source apparatus such that, when lighting said organic EL element, said organic EL element is lighted after a certain time has elapsed since said cooling means has started, and such that, when extinguishing said organic EL element, said cooling means is stopped after reducing drive current going to said organic EL element; and
extinguishing said organic EL element thereafter.

35. The control method for a light source apparatus according to claim 34, applied to a projection type projection display apparatus, further comprising:

displaying an image on said liquid crystal display element; and enlarging and projecting the image by a projection lens.

36. A projection display apparatus which illuminates a liquid crystal display element by a light source apparatus controlled by the control method according to claim 34, wherein said projection display apparatus enlarges and projects an image displayed on said liquid crystal display element by a projection lens.

37. A projection display apparatus comprising:

a transmissive liquid crystal panel that displays image;

a light emitting unit, positioned on one surface of said liquid crystal panel;

said unit having a transparent substrate and a light emitting layer made up of an organic EL element provided on the transparent substrate;

a means for raising the light-emission efficiency formed integrally on the transparent substrate of said light emitting unit, said means for raising light-emission efficiency being a microprism array formed two-dimensionally on said transparent substrate.

* * * * *